United States Patent
Hirotaki et al.

(10) Patent No.: US 12,098,238 B2
(45) Date of Patent: Sep. 24, 2024

(54) CURABLE RESIN, CURABLE RESIN COMPOSITION, CURED PRODUCT, ELECTRONIC DEVICE, LAMINATED BOARD MATERIAL, ELECTRONIC COMPONENT ENCAPSULANT, AND METHOD FOR PRODUCING CURABLE RESIN

(71) Applicant: Central Glass Company, Limited, Ube (JP)

(72) Inventors: Kensuke Hirotaki, Kawagoe (JP); Hirokatsu Nagura, Kawagoe (JP); Kenji Hosoi, Kawagoe (JP); Yukari Hara, Kawagoe (JP)

(73) Assignee: Central Glass Company, Limited, Ube (JP)

( * ) Notice: Subject to any disclaimer, the term of this patent is extended or adjusted under 35 U.S.C. 154(b) by 162 days.

(21) Appl. No.: 17/800,336

(22) PCT Filed: Feb. 24, 2021

(86) PCT No.: PCT/JP2021/006760
§ 371 (c)(1),
(2) Date: Aug. 17, 2022

(87) PCT Pub. No.: WO2021/172319
PCT Pub. Date: Sep. 2, 2021

(65) Prior Publication Data
US 2023/0097638 A1 Mar. 30, 2023

(30) Foreign Application Priority Data
Feb. 28, 2020 (JP) .................. 2020-033227

(51) Int. Cl.
*C08G 59/06* (2006.01)

(52) U.S. Cl.
CPC ..................... *C08G 59/06* (2013.01)

(58) Field of Classification Search
None
See application file for complete search history.

(56) References Cited

U.S. PATENT DOCUMENTS

| | | | |
|---|---|---|---|
| 4,365,098 A * | 12/1982 | Mark | C07C 39/367 |
| | | | 568/726 |
| 9,550,711 B2 | 1/2017 | Nakatsuji et al. | |
| 10,087,284 B2 | 10/2018 | Nakatsuji et al. | |
| 2014/0100342 A1 | 4/2014 | Nakatsuji et al. | |
| 2016/0208431 A1 | 7/2016 | Dai et al. | |
| 2017/0088666 A1 | 3/2017 | Nakatsuji et al. | |

FOREIGN PATENT DOCUMENTS

| | | |
|---|---|---|
| CN | 106467653 A | 3/2017 |
| CN | 109415489 A | 3/2019 |
| JP | 2003-40971 A | 2/2003 |
| JP | 2007-246819 A | 9/2007 |
| JP | 2013-10941 A | 1/2013 |
| JP | 2013-155336 A | 8/2013 |
| JP | 2013-155337 A | 8/2013 |

OTHER PUBLICATIONS

Xiaohui L., et al. Bisphenol AF: Halogen bonding effect is a major driving force for the dual ERa-agonist and ERB-antagonist activities, Bioorganic & Medicinal Chemistry, vol. 28, Issue 3, Available online Dec. 18, 2019 (Year: 2019).*
Chinese-language Office Action issued in Chinese Application No. 202180016833.5 dated Dec. 5, 2023 (6 pages).
Prakash, G. K. S. et al., "Fluoroanalogs of DDT: Superacidic $BF_3$—H2O Catalyzed Facile Synthesis of 1,1, 1-Trifluoro-2,2-diarylethanes and 1,1-Difluoro-2,2-diarylethanes", Organic Letters, Jul. 12, 2011, pp. 4128-4131, vol. 13, No. 5 (65 Pages).
International Search Report (PCT/ISA/210) issued in PCT Application No. PCT/JP2021/006760 dated May 11, 2021 with English translation (five (5) pages).
Japanese-language Written Opinion (PCT/ISA/237) issued in PCT Application No. PCT/JP2021/006760 dated May 11, 2021 (three (3) pages).
Extended European Search Report issued in European Application No. 21759576.8 dated Sep. 7, 2023 (3 pages).

* cited by examiner

*Primary Examiner* — Megan McCulley
(74) *Attorney, Agent, or Firm* — Crowell & Moring LLP

(57) ABSTRACT

A curable resin represented by General Formula (1). In General Formula (1), $R_1$ each independently represent a monovalent substituent (an alkyl group, an alkoxy group, a fluorine atom, and the like), m is 0 to 4, n is 0 to 40, and $R^2$'s are each independently a monovalent group including a polymerizable functional group.

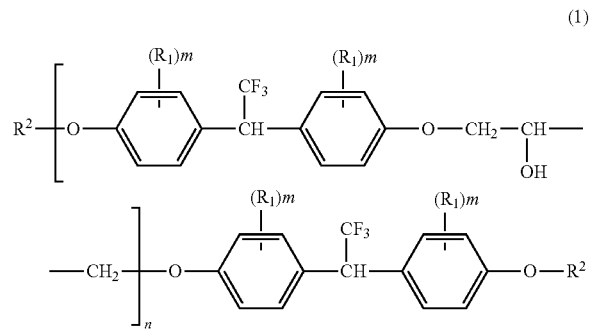

23 Claims, No Drawings

CURABLE RESIN, CURABLE RESIN COMPOSITION, CURED PRODUCT, ELECTRONIC DEVICE, LAMINATED BOARD MATERIAL, ELECTRONIC COMPONENT ENCAPSULANT, AND METHOD FOR PRODUCING CURABLE RESIN

TECHNICAL FIELD

The present invention relates to a curable resin, a curable resin composition, a cured product, an electronic device, a laminated board material, an electronic component encapsulant, and a method for producing a curable resin.

BACKGROUND ART

The application of curable resins such as epoxy resins and epoxy (meth)acrylate resins to insulating materials, adhesives, semiconductor encapsulants, resist materials, laminated boards, and the like is being actively investigated.

For example, Patent Document 1 describes an epoxy resin obtained by reacting a bisphenol compound having a 1,1,1,3,3,3-hexafluoro-2,2-propanediyl group (may be described below as "—$C(CF_3)_2$— group (structure)"), with an epihalohydrin as represented by the following chemical formula. Patent Document 1 describes that, by using this epoxy resin, a cured body is obtained with excellent adhesive strength, moisture absorption resistance, thermal degradation resistance, and ultraviolet (UV) degradation resistance, in which crack fractures due to cold/heat cycling do not easily occur.

[Chem. 1]

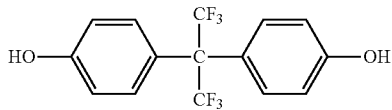

Epoxy resins including a chemical structure similar to that of the epoxy resin described in Patent Document 1 are also described in Patent Documents 2, 3, and the like.

In addition, Patent Document 4 describes an epoxy (meth)acrylate resin having a —$C(CF_3)_2$— structure.

RELATED DOCUMENT

Patent Document

[Patent Document 1] Japanese Unexamined Patent Publication No. 2013-155336
[Patent Document 2] Japanese Unexamined Patent Publication No. 2013-155337
[Patent Document 3] Japanese Unexamined Patent Publication No. 2007-246819
[Patent Document 4] Japanese Unexamined Patent Publication No. 2003-40971

SUMMARY OF THE INVENTION

Technical Problem

In research for improving epoxy resins, epoxy (meth)acrylate resins, and curable resin compositions including these resins, the present inventors found that the viscosity of curable resins having the —$C(CF_3)_2$—structure described in Patent Document 1 and the like is comparatively high and may be difficult to handle industrially, for example.

The present invention was created in consideration of these circumstances. One of the objects of the present invention is to provide a curable resin with a comparatively low viscosity.

Solution to Problem

The present inventors completed the invention provided below and solved the problem described above.

According to the present invention, there is provided a curable resin represented by General Formula (1).

[Chem. 2]

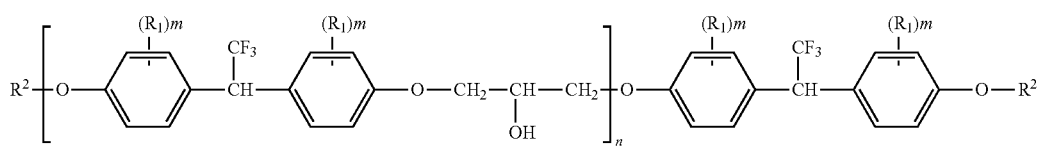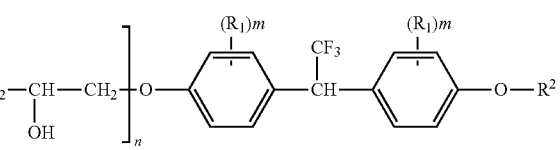

(1)

In General Formula (1), $R_1$ each independently represent a monovalent substituent, m is 0 to 4, n is 0 to 40, and $R^2$'s are each independently a monovalent group including a polymerizable functional group.

In addition, according to the present invention, there is provided a curable resin composition including the curable resin described above.

In addition, according to the present invention, there is provided a cured product of the curable resin composition described above.

In addition, according to the present invention, there is provided an electronic device provided with the cured product described above.

In addition, according to the present invention, there is provided a laminated board material provided with the curable resin composition described above, or a cured product of the curable resin composition.

In addition, according to the present invention, there is provided an electronic component encapsulant including the curable resin composition described above, or a cured product of the curable resin composition.

In addition, according to the present invention, there is provided a method for producing the curable resin described above, the method including reacting a bisphenol compound represented by General Formula (10) with epihalohydrin in the presence of a base.

[Chem. 3]

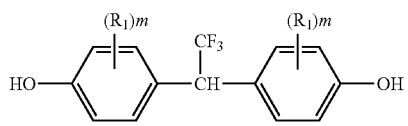
(10)

In General Formula (10), $R_1$ and m have the same definitions as in General Formula (1).

In addition, according to the present invention, there is provided the method for producing the curable resin described above, further including reacting an epoxy resin compound represented by General Formula (2) with (meth) acrylic acid.

[Chem. 4]

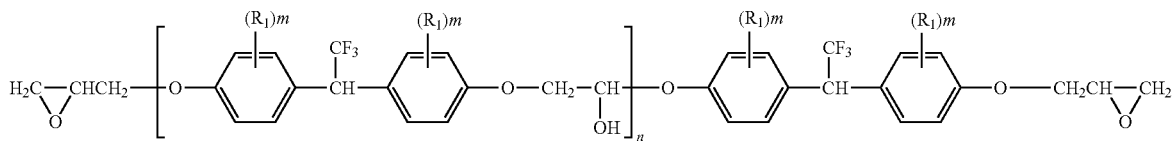
(2)

In General Formula (2), $R_1$, m, and n have the same definitions as in General Formula (1).

In addition, according to the present invention, there is provided the method for producing the curable resin described above, further including reacting a bisphenol compound represented by General Formula (10) with glycidyl (meth)acrylate.

[Chem. 5]

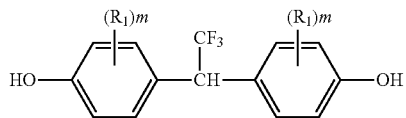
(10)

In General Formula (10), $R_1$ and m have the same definitions as in General Formula (1).

Advantageous Effects of Invention

The curable resin of the present invention has a comparatively low viscosity.

DESCRIPTION OF EMBODIMENTS

A detailed description of embodiments of the present invention will be given below.

In the present specification, the description "X to Y" in the description of numerical ranges represents X or more and Y or less, unless otherwise stated. For example, "1 to 5% by mass" means "1% by mass or more and 5% by mass or less".

In the description of groups (atomic groups) in the present specification, description that does not record whether a group is substituted or unsubstituted encompasses both groups not having substituents and groups having substituents. For example, "alkyl group" encompasses not only alkyl groups not having substituents (unsubstituted alkyl groups) but also alkyl groups having substituents (substituted alkyl groups).

In the present specification, the description "(meth)acrylate" represents both acrylate and methacrylate compounds. In the same manner, the description "(meth)acrylic acid" represents both acrylic acid and methacrylic acid. The same also applies to other similar descriptions.

The term "electronic device" in the present specification is used in a sense that encompasses elements, devices, and end products to which electronic technology is applied, such as semiconductor chips, semiconductor elements, printed wiring boards, electrical circuit display apparatuses, information communication terminals, light emitting diodes, physical batteries, chemical batteries, and the like.

<Curable Resin>

The curable resin of the present embodiment is represented by General Formula (1).

[Chem. 6]

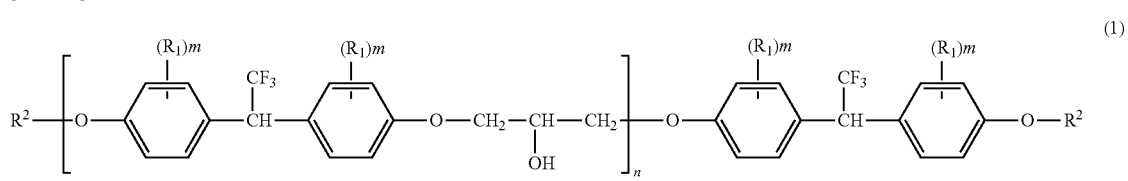
(1)

In General Formula (1),
$R_1$ represents a monovalent substituent,
m is 0 to 4,
n is 0 to 40, and
$R^2$'s are each independently a monovalent group including a polymerizable functional group.

The monovalent substituents of $R_1$ are not limited and preferable examples thereof include alkyl groups, alkoxy groups, cycloalkyl groups, aryl groups, alkenyl groups, alkynyl groups, aryloxy groups, amino groups, alkylamino groups, arylamino groups, cyano groups, nitro groups, silyl groups, halogeno groups (for example, fluoro groups), and the like and the above may have substituents such as fluorine atoms and carboxyl groups. Among the above, alkyl groups, alkoxy groups, fluorinated alkyl groups (for example, trifluoromethyl groups), halogeno groups (for example, fluoro groups), and nitro groups are more preferable.

The alkyl group of $R_1$ is not limited, but is preferably a linear or branched alkyl group with 1 to 6 carbon atoms, among which an n-butyl group, an s-butyl group, an isobutyl group, a t-butyl group, an n-propyl group, an i-propyl group, an ethyl group, and a methyl group are preferable and an ethyl group and a methyl group are particularly preferable.

The alkoxy group of $R_1$ is not limited, but is preferably a linear or branched alkoxy group with 1 to 6 carbon atoms, among which an n-butoxy group, an s-butoxy group, an isobutoxy group, a t-butoxy group, an n-propoxy group, an i-propoxy group, an ethoxy group, and a methoxy group are preferable and an ethoxy group and a methoxy group are particularly preferable.

The alkyl groups and alkoxy groups of $R_1$ may be substituted on any carbon thereof with, for example, halogen atoms, alkoxy groups, and haloalkoxy groups in any number and in any combination. Furthermore, in a case where the number of $R_1$ in General Formula (1) is two or more, two or more $R_1$ may be linked together to form a saturated or unsaturated, monocyclic or polycyclic cyclic group with 3 to 10 carbon atoms.

The curable resin of the present embodiment includes a structure referred to as a "benzene ring-CH ($CF_3$)-benzene ring" in which a 1,1,1-trifluoro-2,2-ethanediyl group (may be represented below as a "(—CH($CF_3$)—) group") is linked to benzene rings. It is considered that, due to this structure (in particular, —CH ($CF_3$)—), the main chain in the curable resin of the present embodiment is appropriately flexible in comparison with the epoxy resin as described in Patent Document 1 (including the structure represented by —C($CF_3$)$_2$—) and the epoxy (meth)acrylate resin described in Patent Document 4. Therefore, it is considered that the curable resin of the present embodiment has a comparatively low viscosity.

That the curable resin is "low viscosity" leads to the benefit that, for example, in a case where the curable resin and a filler (particles) are mixed to prepare a curable resin composition, it is easy to increase the amount of filler introduced.

Here, it is considered that, in a case where the curable resin is made to be low viscosity by designing the main chain to be appropriately flexible or the like, for example, the heat resistance of the resin may decrease (the glass transition temperature may become lower) or the like. However, the heat resistance (glass transition temperature) of the curable resin of the present embodiment tends to be comparatively good. It is assumed that, a balance between the low viscosity and heat resistance of the resin is achieved at a high level due to the structure in which two benzene rings are linked by a group having only one trifluoromethyl group, that is, "—CH($CF_3$)—".

Moreover, as the findings of the present inventors, epoxy resins and epoxy (meth)acrylate resins including the structure represented by —C($CF_3$)$_2$—, as described in Patent Document 1 and the like, crystallize easily. It is considered that this is probably due to the high symmetry of the chemical structure. On the other hand, the curable resins of the present embodiment do not crystallize easily. It is assumed that this is related to the chemical structure, which has low symmetry, that is, —CH($CF_3$)—, being included in the resin. The fact that the curable resin of the present embodiment does not crystallize easily (easily becomes amorphous) means, for example, that it is easier to form a homogeneous and isotropic film by using the curable resin of the present embodiment.

The description relating to the curable resin of the present embodiment will be continued.
(More Detailed Description of General Formula (1))

$R^2$ is preferably a monovalent group including an epoxy group or a monovalent group including an ethylenically unsaturated group, from the viewpoint of appropriate curability and the like.

More preferably, $R^2$ is a monovalent group including a glycidyl group or a monovalent group including an epoxy (meth)acrylate skeleton. "Epoxy (meth)acrylate skeleton" means a skeleton formed by the addition of a carboxy group of (meth)acrylic acid to an epoxy group.

Here, in the present specification, in a case where $R^2$ is a monovalent group including an epoxy group, the curable resin represented by General Formula (1) may be described as an "epoxy resin". In addition, in the present specification, in a case where $R^2$ is a monovalent group including a (meth)acrylate skeleton, the curable resin represented by General Formula (1) may be described as an "epoxy (meth)acrylate" or an "epoxy (meth)acrylate resin".

Examples of preferable $R^2$ include the following. Of course, $R^2$ is not limited only thereto.

[Chem. 7]

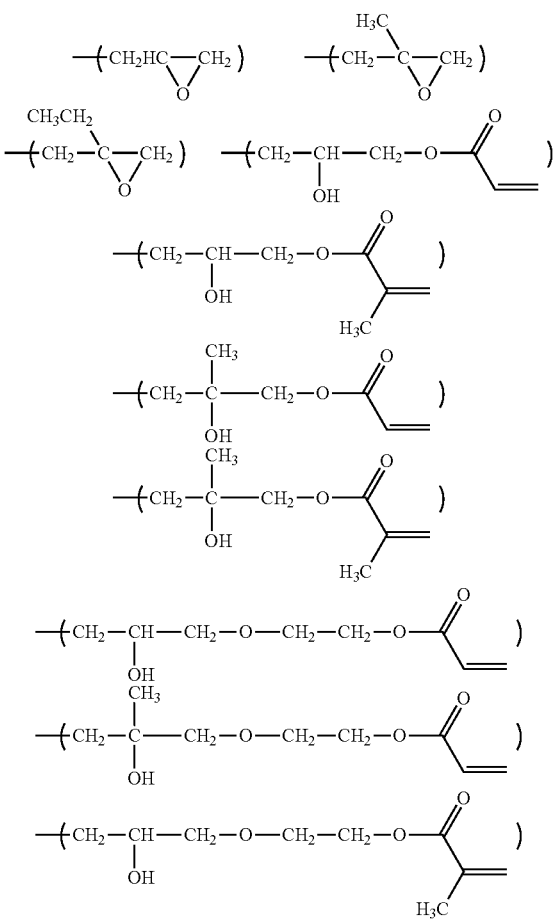

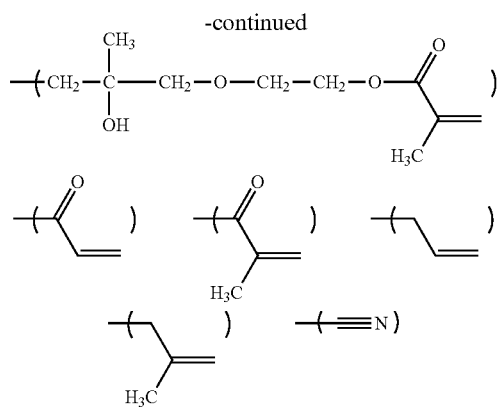

As a specific aspect of a case where $R^2$ in General Formula (1) is a monovalent group including an epoxy group, examples include the curable resin represented by General Formula (2).

[Chem. 8]

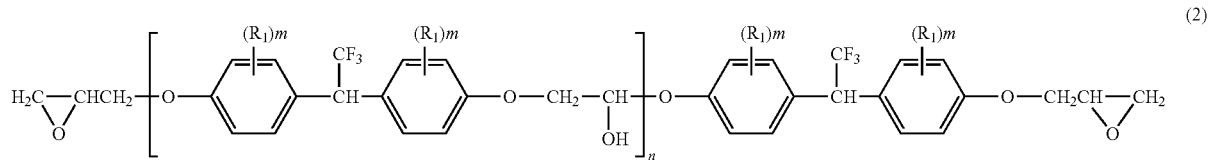

(2)

In General Formula (2), $R_1$, m, and n have the same definitions as in General Formula (1).

As a specific aspect of a case where $R^2$ in General Formula (1) is a monovalent group including an ethylenically unsaturated group, possible examples include a curable resin represented by General Formula (3).

[Chem. 9]

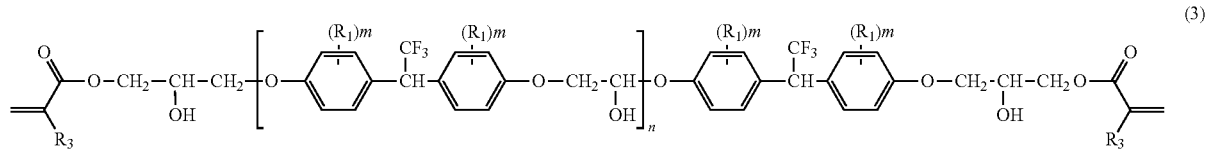

(3)

In General Formula (3), $R_1$, m, and n have the same definitions as in General Formula (1) and the two $R_3$'s are each independently hydrogen or methyl groups.

Among the monovalent substituents of $R_1$, examples of halogen atoms include fluorine atoms (F), chlorine atoms (Cl), bromine atoms (Br), iodine atoms (I), and the like. In a case of considering application to insulating materials and the like, F is preferable as a halogen atom. F is particularly useful in a case where there is a demand for electrical properties such as low dielectric constant and/or low dielectric loss tangent.

In General Formula (1), it is possible to adjust the viscosity and various properties of the curable resin by changing $R_1$ and m. From the viewpoint of reducing the viscosity as much as possible, m is preferably 0. For example, the curable resins represented by General Formulas (4), (8), and (9) are curable resins corresponding to m=0.

On the other hand, in terms of the combination of low viscosity and various properties, m in General Formula (1) may be 1 to 4. From the viewpoint of a balance of various performances, m is, for example, 1 or 2 and $R_1$ is preferably a fluorine atom or a methyl group. For example, the curable resins represented by General Formulas (5), (6), and (7) are curable resins where m is 1 or more.

Among the curable resins corresponding to General Formula (1), particularly preferable examples are given below. In the following, n has the same definition as in General Formula (1),

[Chem. 10]

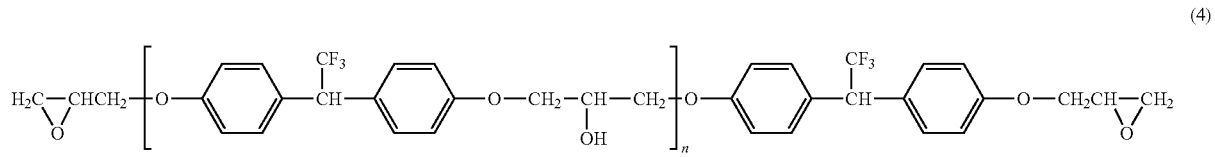

(4)

-continued

[Chem. 11]

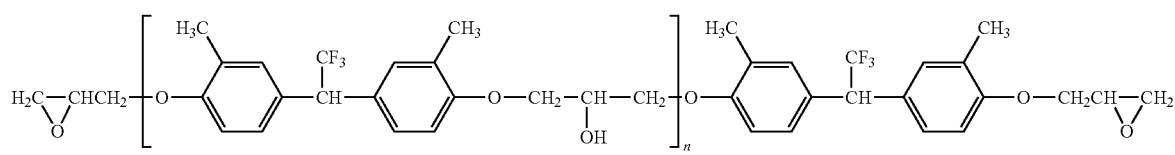
(5)

[Chem. 12]

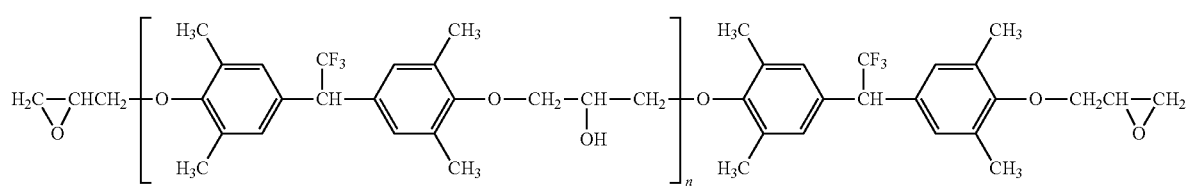
(6)

[Chem. 13]

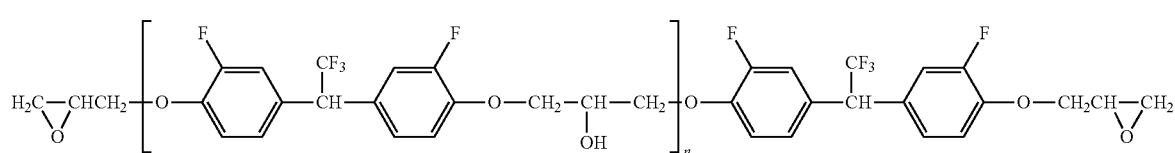
(7)

[Chem. 14]

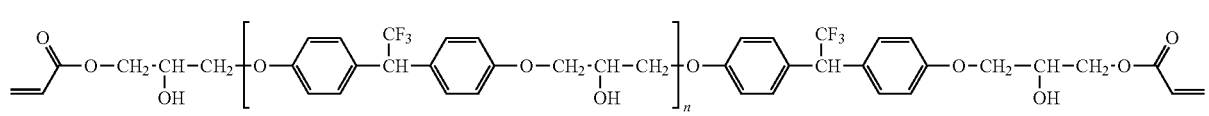
(8)

[Chem. 15]

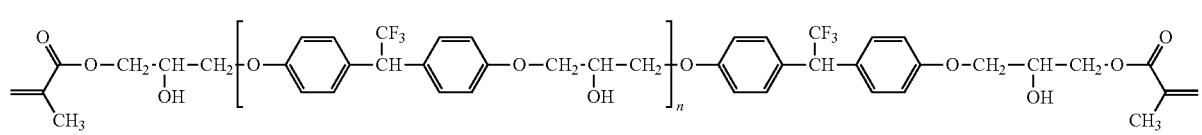
(9)

The curable resin of the present embodiment may be, for example, two or more curable resins in which n is different in General Formula (1). In other words, the curable resin of the present embodiment may be a "mixture" of two or more curable resins in which n is different in General Formula (1).

Preferably, the curable resin of the present embodiment includes a curable resin in which n is 0 and a curable resin in which n is 1 to 40 (more preferably 1 to 20 and even more preferably 1 to 10) in General Formula (1). Using such curable resins makes it possible to achieve both low viscosity and heat resistance at a higher level. That is, the curable resin where n is 0 contributes in particular to the low viscosity since the molecular weight thereof is low, while the curable resin where n is 1 to 40 contributes in particular to the improved heat resistance. It is considered that the combination of these contributions achieves both low viscosity and heat resistance at a higher level.

In a case where the curable resin of the present embodiment includes a curable resin in which n is 0 and a curable resin in which n is 1 to 40 in General Formula (1), the ratio of the curable resin in which n is 0 in the total curable resin represented by General Formula (1) is preferably 10% to 95% and more preferably 20% to 95%. It is possible to determine this ratio from the respective peak areas of the graph when the curable resin is measured by liquid chromatography (LC).

(Total Chlorine Content)

The total chlorine content of the curable resin of the present embodiment is preferably 0 ppm to 4000 ppm and more preferably 0 ppm to 2000 ppm. By the total chlorine content not being excessively large, for example, it is possible to reduce corrosion problems when the curable resin is applied to various applications.

It is possible to measure the "total chlorine content" on the basis of JIS K 7243-3:2005.

(Properties)

The curable resin of the present embodiment has a low viscosity, as described above. In this respect, it is possible for the curable resin of the present embodiment to be liquid (having fluidity) at comparatively low temperatures.

Specifically, it is possible for the curable resin of the present embodiment to be liquid (having fluidity) at 40° C. More specifically, the viscosity of the curable resin of the present embodiment (in particular, the epoxy resin) at a shear rate of 25/s and a temperature of 40° C. is preferably 25,000 cP or less, more preferably 1,000 cP to 25,000 cP, and even more preferably 2,000 cP to 20,000 cP.

It is possible to perform the measurement of the viscosity, for example, using the apparatus and conditions described in the Examples described below.

(Others)

The epoxy equivalent weight of the curable resin (epoxy resin) of the present embodiment is preferably 150 to 100,000 g/equivalent weight, more preferably 150 to 10,000 g/equivalent weight, and even more preferably 150 to 2,000 g/equivalent weight. The epoxy equivalent weight being in the preferable numerical range makes it possible to develop appropriate curability.

The weight average molecular weight of the curable resin of the present embodiment is preferably 100 to 500,000, more preferably 100 to 100,000, and even more preferably 100 to 10,000. The number average molecular weight is preferably 100 to 100,000, more preferably 100 to 10,000, and even more preferably 100 to 5,000. The degree of dispersion is preferably 1 to 50, more preferably 1 to 20, and even more preferably 1 to 10. It is possible to determine the weight average molecular weight by gel permeation chromatography (GPC) using polystyrene as a standard.

The curable resin of the present embodiment may be in powder form or liquid form at room temperature (23° C.). Here, in a case where the curable resin of the present embodiment is in powder form, use as a curable resin solution is also possible by dissolving the powder in any solvent.

Example of Method for Producing Curable Resin: Method 1

It is possible to preferably produce the curable resins of the present embodiment (in particular, epoxy resins) by reacting a bisphenol compound represented by General Formula (10) with epihalohydrin (typically epichlorohydrin or epibromohydrin) in the presence of a base.

[Chem. 16]

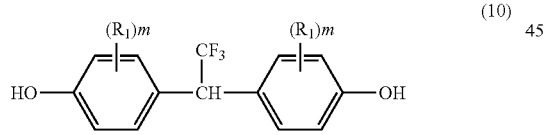

(10)

In General Formula (10), the definitions and preferable forms of $R_1$ and m are the same as in General Formula (1).

It is possible to produce compounds represented by General Formula (10), for example, by reacting trifluoroacetaldehyde ethyl hemiacetal with a phenol compound in the presence of a Lewis acid (Bull. Chem. Soc. Jpn. 74, 377-383 (2001)) or the like by adopting a known production method.

For reference, specific examples of compounds represented by General Formula (10) are given below.

[Chem. 17]

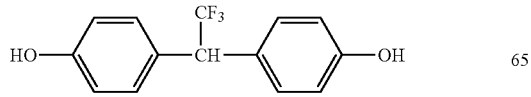

-continued

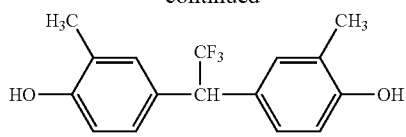

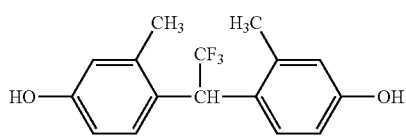

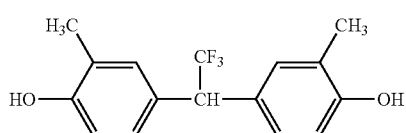

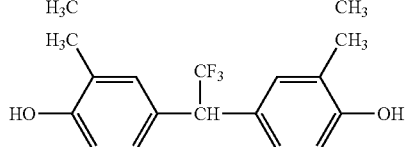

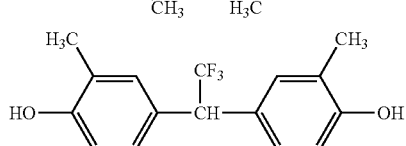

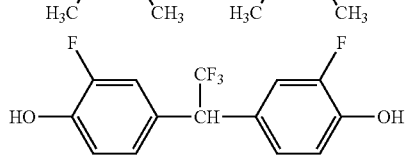

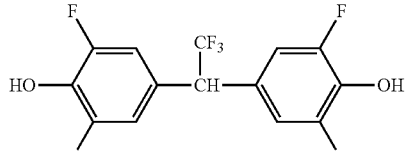

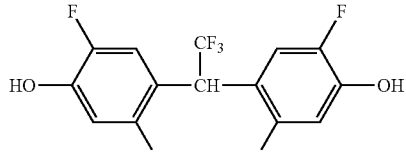

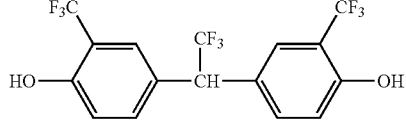

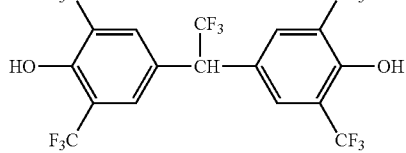

-continued

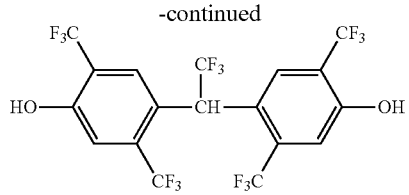

The amount of epihalohydrin (typically epichlorohydrin or epibromohydrin) used in the reaction is preferably 0.1 to 100 mol with respect to 1 mol of a hydroxyl group of the bisphenol compound represented by General Formula (10), more preferably 1.0 to 50 mol, and even more preferably 1.5 to 40 mol.

Typically, examples of bases used in the reaction include alkali metal hydroxides, alkali metal alkoxides, carbonates of alkali metals, and the like. Specifically, possible examples thereof include sodium hydroxide, potassium hydroxide, lithium hydroxide, sodium methoxide, potassium methoxide, lithium methoxide, sodium ethoxide, potassium ethoxide, lithium ethoxide, sodium butoxide, potassium butoxide, lithium butoxide, sodium carbonate, potassium carbonate, lithium carbonate, and the like. Only one type of these bases may be used, or two or more types may be used in a combination.

The preferable form in the reaction is usually to add an alkali metal hydroxide such as sodium hydroxide or potassium hydroxide as a base to the reaction system in a solid or aqueous solution state so as to set the reaction system to "alkaline conditions".

The added amount of the base is preferably 0.1 to 50 mol with respect to 1 mol of a hydroxyl group of the bisphenol compound represented by General Formula (10) and more preferably 1 to 10 mol.

It is possible to perform the reaction under ambient pressure (0.1 MPa; absolute pressure) or under reduced pressure. The reaction temperature is usually 20° C. to 150° C. in a case of reactions under ambient pressure and 30° C. to 80° C. in a case of reactions under reduced pressure.

In the reaction, dehydration is carried out as necessary by a method in which the reaction liquid is azeotropized while being held at a predetermined temperature, the volatilizing steam is cooled to carry out oil/water separation on the obtained condensate, and the oil content with the water removed is returned to the reaction system.

For the addition of the alkali metal hydroxide, usually, alkali metal hydroxide is added to the reaction system intermittently or continuously in small amounts over a period of 0.1 to 10 hours in order to suppress rapid reactions.

The total reaction time is usually 1 to 15 hours. For the reaction, an analytical instrument such as a nuclear magnetic resonance apparatus (NMR) or liquid chromatography (LC) is used and the time point at which it is confirmed that the reaction conversion rate reached a predetermined value is preferably set as the end point of the reaction.

After the reaction finished, insoluble by-product salts are preferably removed by filtration or removed by washing with water. Thereafter, the unreacted epihalohydrin is preferably removed by decompression distillation. In this manner, a desired curable resin (epoxy resin) is obtained.

In the reaction, catalysts may be used such as quaternary ammonium salts such as tetramethylammonium chloride and tetraethylammonium bromide; tertiary amines such as benzyl dimethylamine and 2,4,6-tris(dimethylamino methyl)phenol; imidazoles such as 2-ethyl-4-methylimidazole and 2-phenylimidazole; phosphonium salts such as ethyltriphenylphosphonium iodide; and phosphines such as triphenylphosphine.

In the reaction, inert organic solvents may be used such as alcohols such as ethanol and isopropyl alcohol; ketones such as acetone and methyl ethyl ketone; ethers such as dioxane and ethylene glycol dimethyl ether; glycol ethers such as methoxypropanol; and non-protic polar solvents such as dimethyl sulfoxide and dimethylformamide. Only one type of these organic solvents may be used, or two or more types may be mixed and used.

In a case where the amount of saponified halogens in the obtained curable resin (epoxy resin) is excessively high, a purified curable resin with a sufficiently decreased amount of saponified halogens may be obtained by reprocessing. As a specific procedure, (i) a crude curable resin is re-dissolved in an inert organic solvent such as isopropyl alcohol, methyl ethyl ketone, methyl isobutyl ketone, toluene, xylene, dioxane, methoxypropanol, or dimethyl sulfoxide to make a solution, (ii) alkali metal hydroxides are added to the solution as a solid or an aqueous solution, (iii) thereafter, a ring closure reaction is performed for 0.5 to 8 hours at a temperature of approximately 20° C. to 120° C., and (iv) thereafter, excess alkali metal hydroxide and by-product salts are removed by a method such as washing with water and the organic solvent is further removed by distillation under reduced pressure. In this manner, it is possible to obtain a purified curable resin represented by General Formula (1).

Example of Method for Producing Curable Resin: Method 2

It is possible to produce the curable resins of the present embodiment (in particular epoxy (meth)acrylate resins) by reacting an epoxy resin compound represented by General Formula (2) with (meth)acrylic acid.

[Chem. 18]

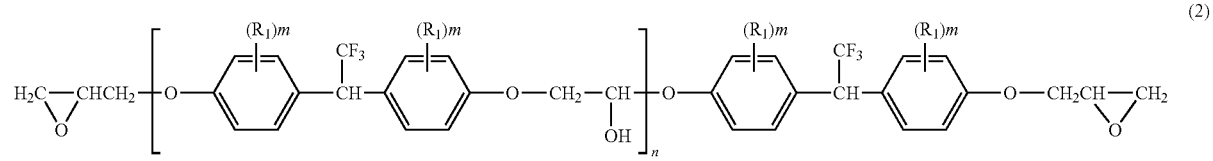

In General Formula (2), $R_1$, m, and n have the same definitions as in General Formula (1).

It is possible to obtain the epoxy resin compound represented by General Formula (2), for example, by the method described above in <Example of Method for Producing Curable Resin: Method 1>

Known catalysts may be used in the reaction of the epoxy resin compound represented by General Formula (2) with (meth)acrylic acid. Other than this, the reaction conditions, usable reagents, and the like are not particularly limited and it is possible to apply findings from synthetic chemistry as appropriate. In addition, during the reaction and purification, the matters described in the above <Example of Method for Producing Curable Resin: Method 1> may be applied.

For specific examples of the reaction conditions for the epoxy resin compound represented by General Formula (2) and (meth)acrylic acid, refer to, for example, Synthesis Examples 8 and 9 described below.

Example of Method for Producing Curable Resin: Method 3

It is possible to produce the curable resins of the present embodiment (in particular, epoxy (meth)acrylate resins) by reacting a bisphenol compound represented by General Formula (10) with glycidyl (meth)acrylate.

[Chem. 19]

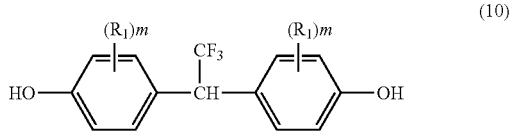
(10)

In General Formula (10), $R_1$ and m have the same definitions as in General Formula (1).

The method for producing the compound represented by General Formula (10) is as described in <Example of Method for Producing Curable Resin: Method 1>.

Known catalysts may be used in the reaction of the compound represented by General Formula (10) with glycidyl (meth)acrylate. Other than this, the reaction conditions, usable reagents, and the like are not particularly limited and it is possible to apply findings from synthetic chemistry as appropriate. In addition, during the reaction and purification, the matters described in the above <Example of Method for Producing Curable Resin: Method 1> may be applied.

For specific examples of reaction conditions for a compound represented by General Formula (10) and glycidyl (meth)acrylate, refer to, for example, Synthesis Example 10 below.

<Curable Resin Composition>

The curable resin composition of the present embodiment includes at least the curable resin represented by General Formula (1) and the like.

As an example, the curable resin composition of the present embodiment includes a curable resin represented by General Formula (1) and the like and a curing agent. In such a case, the composition is cured by the reaction between the curable resin and the curing agent.

As another example, the curable resin composition of the present embodiment does not necessarily include a curing agent. In such a case, due to the polymerization reaction of the polymerizable functional group included in $R^2$ of General Formula (1), the curable resin increases in molecular weight such that the composition is cured.

A description of the components preferably included in the curable resin composition of the present embodiment will be given below.

(Curing Agent)

In a case where the curable resin composition includes a curing agent, the type of curing agent is not particularly limited. Possible examples of curing agents include amine-based curing agents, acid anhydride-based curing agents, phenol-based curing agents, and the like. In particular, these curing agents are preferably used in a case where the curable resin includes epoxy groups.

More specifically, possible examples of amine-based curing agents include aliphatic and alicyclic amines such as diethylenetriamine, triethylenetetramine, tetraethylenepentamine, N-aminoethylpiperazine, isophorone diamine, bis(4-aminocyclohexyl) methane, bis(aminomethyl)cyclohexane, m-xylylenediamine, and 3,9-bis(3-aminopropyl)-2,4,8,10-tetraspiro[5,5]undecane, aromatic amines such as metaphenylenediamine, diaminodiphenylmethane, and diaminodiphenylsulfone, tertiary amines such as benzyl dimethylamine, 2,4,6-tris(dimethylaminomethyl)phenol, 1,8-diazabicyclo-(5,4,0)-undecen-7,1,5-diazabicyclo-(4,3,0)-nonen-7, salts thereof, and the like.

More specifically, possible examples of acid anhydride-based curing agents include aromatic acid anhydrides such as phthalic anhydride, trimellitic anhydride, and pyromellitic anhydride, alicyclic acid anhydrides such as tetrahydrophthalic anhydride, methyl tetrahydrophthalic anhydride, hexahydrophthalic anhydride, methyl hexahydrophthalic anhydride, methyl endomethylenetetrahydrophthalic acid, and trialkyltetrahydrophthalic anhydride, and the like.

More specifically, possible examples of phenol-based curing agents include divalent phenols such as catechol, resorcinol, hydroquinone, bisphenol F, bisphenol A, bisphenol AF, bisphenol S, and biphenol, phenol novolacs, cresol novolacs, bisphenol A novolacs, tris-hydroxyphenylmethanes, aralkyl polyphenols, and the like.

Polyvalent phenols such as dicyclopentadiene polyphenols are also possible examples of phenol-based curing agents.

Other than this, examples of curing agents also include imidazole compounds and salts thereof, $BF_3$ complex compounds of amines, Brønsted acid salts such as aliphatic sulfonium salts, aromatic sulfonium salts, iodonium salts and phosphonium salts, organic acid hydrazides such as dicyandiamides, adipic acid dihydrazide, and phthalic acid dihydrazide, polycarboxylic acids such as adipic acid, sebacic acid, terephthalic acid, trimellitic acid, and carboxyl group-containing polyesters, and the like.

In a case where the curable resin composition of the present embodiment includes a curing agent, only one curing agent may be included or curing agents with two or more different chemical structures may be included.

In a case where the curable resin composition of the present embodiment includes a curing agent, the amount thereof may be appropriately adjusted based on the epoxy equivalent weight or the like of the curable resin (epoxy resin). Typically, in a case where a curing agent is used, the amount thereof is approximately 0.1 to 100 parts by mass with respect to 100 parts by mass of the curable resin (epoxy resin).

(Curing Accelerator)

The curable resin composition of the present embodiment may include a curing accelerator. In such a case, the curable resin composition of the present embodiment may or may not include a curing agent. In the former case, it is considered that the composition is cured mainly by advancing a bond-forming reaction between the curable resin (epoxy resin) and the curing agent. In the latter case, it is considered that the composition is cured mainly by a reaction between the curable resins (epoxy resins) (cationic polymerization of the epoxy groups).

As curing accelerators, it is possible to use curing accelerators for general epoxy resins such as tertiary amines, imidazoles, organic phosphine compounds or salts thereof, and metal soaps such as zinc octylate and tin octylate.

In a case where the curable resin composition of the present embodiment includes a curing accelerator, only one curing accelerator may be included or curing accelerators with two or more different chemical structures may be included.

In a case where the curable resin composition of the present embodiment includes a curing accelerator, the amount thereof may be appropriately adjusted. Typically, in a case where a curing accelerator is used, the amount thereof is approximately 0.001 to 10 parts by mass with respect to 100 parts by mass of the curable resin (epoxy resin).

(Combination Resin)

The curable resin composition of the present embodiment may include resins (combination resins) other than the curable resin (epoxy resin) represented by General Formula (1), and the like.

Possible examples of the combination resin include an epoxy resin (combination epoxy resin). Possible examples of combination epoxy resins include bifunctional epoxy resins, such as bisphenol A epoxy resins, bisphenol F epoxy resins, bisphenol AD epoxy resins, hydrogenated bisphenol A epoxy resins, hydrogenated bisphenol F epoxy resins, diglycidyl ether of bisphenol A-alkylene oxide adducts, diglycidyl ether of bisphenol F alkylene oxide adducts, bisphenol S epoxy resins, tetramethylbisphenol A epoxy resins, tetramethylbisphenol F epoxy resins, thiodiphenol epoxy resins, dihydroxy diphenyl ether epoxy resins, terpene diphenol epoxy resins, biphenol epoxy resins, tetramethylbiphenol epoxy resins, hydroquinone epoxy resins, methylhydroquinone epoxy resins, dibutylhydroquinone epoxy resins, resorcinol epoxy resins, methylresorcinol epoxy resins, and dihydroxynaphthalene epoxy resins.

In addition, possible examples of multifunctional epoxy resins include phenol novolac epoxy resins, cresol novolac epoxy resins, bisphenol A novolac epoxy resins, dicyclopentadiene phenol epoxy resins, terpene phenol epoxy resins, phenol aralkyl epoxy resins, biphenyl aralkyl epoxy resins, naphthol novolac epoxy resins; epoxy resins produced from various phenol compounds, such as polyvalent phenol resins obtained by a condensation reaction with various aldehydes such as hydroxybenzaldehyde, crotonaldehyde, and glyoxal or modified phenol resins obtained by polycondensation of petroleum-based heavy oil or pitch and formaldehyde polymerization products and phenols in the presence of acid catalysts and epihalohydrin; triglycidyl isocyanurate, and the like.

Furthermore, as combination epoxy resins, examples also include epoxy resins produced from various amine compounds such as diaminodiphenylmethane, aminophenol, and xylenediamine and epihalohydrin, epoxy resins produced from various carboxylic acids such as methyl hexahydroxyphthalic acid and dimer acid and epihalohydrin, diluents for epoxy resins such as glycidyl ethers of aliphatic alcohols, alicyclic epoxy resins represented by 3,4-epoxycyclohexylmethyl-3',4'-epoxycyclohexane carboxylate, and the like.

In a case where the curable resin composition of the present embodiment includes a combination resin, only one combination resin may be included or combination resins with two or more different chemical structures may be included.

In a case where the curable resin composition of the present embodiment includes a combination resin, the amount thereof is, for example, 1 to 80 parts by mass with respect to 100 parts by mass of the curable resin represented by General Formula (1) and the like and preferably 3 to 50 parts by mass.

(Other Components)

In addition to the components described above, it is possible for the curable resin composition of the present embodiment to include one or two or more optional components. Examples of optional components include antioxidants, fillers, coloring agents, resins other than curable resins, curable monomers, oligomers, organic solvents, and the like.

Incidentally, in a case where the curable resin composition of the present embodiment includes a curable resin in which $R^2$ is a monovalent group including an ethylenically unsaturated group in General Formula (1), it is considered that the curable resin composition preferably includes a monofunctional or multifunctional (meth)acrylate compound.

Examples of antioxidants include phenol-based, sulfur-based, and phosphorus-based antioxidants and the like. In a case where antioxidants are used, the amount thereof is usually 0.005 to 5 parts by mass with respect to 100 parts by mass of the curable resin and preferably 0.01 to 1 part by mass.

Possible examples of fillers include metal oxides such as aluminum oxide and magnesium oxide, silicon compounds such as fine silica, fused silica, and crystalline silica, glass beads, metal hydroxides such as aluminium hydroxide, metals such as gold, silver, copper, and aluminium, fluorine resin powders such as polytetrafluoroethylene particles, carbon, rubbers, kaolin, mica, quartz powders, graphite, molybdenum disulfide, boron nitride, and the like.

In a case where fillers are used, the amount thereof is, for example, 1500 parts by mass or less with respect to 100 parts by mass of curable resin and preferably 0.1 to 1500 parts by mass.

Possible examples of coloring agents include inorganic pigments such as titanium dioxide, molybdenum red, Prussian blue, ultramarine blue, cadmium yellow, and cadmium red, organic pigments, carbon black, phosphors, and the like.

In a case where a coloring agent is used, the amount thereof is usually 0.01 to 30 parts by mass with respect to 100 parts by mass of the curable resin.

Possible examples of flame retardants include antimony trioxide, bromine compounds, phosphorus compounds, and the like. In a case where flame retardants are used, the amount thereof is usually 0.01 to 30 parts by mass with respect to 100 parts by mass of the curable resin.

The curable resin composition of the present embodiment may be in the form of a varnish including a solvent. The solvent is typically an organic solvent.

Specifically, possible examples of solvents include one or two or more of ketones such as acetone, methyl ethyl ketone, methyl amyl ketone, methyl isobutyl ketone, and cyclohexanone, esters such as ethyl acetate, butyl acetate, and amyl acetate, ethers such as ethylene glycol monomethyl ether, amides such as N,N-dimethylformamide and N,N-dimethylacetamide, alcohols such as methanol and ethanol, hydrocarbons such as toluene and xylene, and the like.

(Supplement)

In particular, in a case where the curable resin composition of the present embodiment includes a curable resin in which $R^2$ is a monovalent group including an ethylenically unsaturated group in General Formula (1), the curable resin composition preferably includes a radical polymerization initiator.

Possible examples of radical polymerization initiators include azo initiators such as 2,2'-azobisisobutyronitrile, 2,2'-azobis(2-amidinopropane) dihydrochloride, 2,2'-azobis [2-(5-methyl-2-imidazolin-2-yl)propane]dihydrochloride, 2,2'-azobis(2-methylpropionamidine) disulfate, 2,2'-azobis (N,N'-dimethyleneisobutylamidine), and 2,2'-azobis [N-(2-carboxyethyl)-2-methylpropionamidine] hydrate (VA-057, manufactured by FUJIFILM Wako Pure Chemicals Corporation). In addition, possible examples thereof include persulfates such as potassium persulfate and ammonium persulfate, and peroxide initiators such as di(2-ethylhexyl) peroxydicarbonate, di(4-t-butylcyclohexyl) peroxydicarbonate, di-sec-butyl peroxydicarbonate, t-butyl peroxyneodecanoate, t-hexyl peroxypivalate, t-butyl peroxypivalate, dilauroyl peroxide, di-n-octanoyl peroxide, 1,1,3,3-tetramethylbutylperoxy-2-ethylhexanoate, di(4-methyl-benzoyl) peroxide, dibenzoyl peroxide, t-butyl peroxyisobutyrate, 1,1-di(t-hexylperoxy)cyclohexane, t-butyl hydroperoxide, and hydrogen peroxide. Of course, polymerization initiators are not limited only to the above. Only one polymerization initiator may be used or two or more polymerization initiators may be used in combination.

In addition, depending on the application of the curable resin composition, the curable resin composition may include a photo-radical polymerization initiator. Possible examples of photo-radical polymerization initiators include benzophenone-based, benzoin-based, acetophenone-based, thioxanthone-based, alkylphenone-based, acylphosphine oxide-based, titanocene-based, oxime ester-based, oxyphenyl acetate-based, cation-based, and the like. In addition, possible examples thereof include triethanolamine, methyl diethanolamine, triisopropanolamine, 4,4-dimethylaminobenzophenone, 4,4-dimethylaminobenzoic acid ethyl, 4-dimethylaminobenzoic acid isoamyl, 4-dimethylaminobenzoic acid (n-butoxy)ethyl, 4-dimethylaminobenzoic acid 2-ethylhexyl, triphenylamine, and the like. Furthermore, possible examples thereof include known initiators such as arylalkyl ketones, oxime ketones, thiobenzoic acid S-phenyl, titanocenes, aromatic ketones, thioxanthone, benzylquinone derivatives, and ketocoumarins.

<Cured Product, Electronic Device>

It is possible to obtain a cured product by curing the curable resin composition of the present embodiment. It is possible to perform the curing by light and/or heat.

More specifically, the curable resin composition is usually heated at 100° C. to 200° C. for 0.1 to 20 minutes. Due to this, it is possible to obtain a cured product. In order to improve the curing performance, "post curing" may be performed in a range of 70° C. to 200° C. for 0.1 to 10 hours.

It is possible for the cured product to be in a form of a molded body, a laminate, a cast, a film, a base resin for biomaterials, or the like.

As an example, it is possible to obtain a cured product that is a molded body by molding the curable resin composition by pouring or transfer molding, injection molding, or the like, and heating at 30° C. to 250° C. for 30 seconds to 10 hours. More specifically, it is possible to use the curable resin compositions described above as materials for sealing electronic components.

As another example, it is possible to produce a curable material for lamination by coating and/or impregnating (or the like) the curable resin composition described above in a base material (preferably a fiber base material) of glass fibers, carbon fibers, polyester fibers, polyamide fibers, paper, or the like. It is possible to suitably use this curable material for lamination in the production of printed wiring boards such as multilayer electrical laminate boards, build-up laminate boards, and flexible laminate boards.

In short, the curable resin/curable resin composition of the present embodiment is preferably used in the production of electronic devices.

As described above, the curable resin having the structure represented by General Formula (1) has a low viscosity. This leads to the advantage that it is possible to easily increase the amount of filler introduced in a case where, for example, a curable resin and filler (particles) are mixed to prepare a curable resin composition. By increasing the amount of filler introduced, it is easy to improve the properties (in particular, electrical and magnetic properties) of the final cured product.

In addition, the low viscosity of the curable resin having the structure represented by General Formula (1) also leads to the advantages that, in curable materials for lamination, (i) coating and impregnation of the curable resin composition in the base material becomes easier, and (ii) sufficient coating and impregnation of the curable resin composition are possible, even when the usage amount of the curable resin composition is a small amount.

From another viewpoint, the low viscosity means that, due to the structure represented by General Formula (1) including fluorine, the cured product tends to have a low dielectric constant and low dielectric loss tangent. In this respect, it is considered that the curable resin/curable resin composition/cured product of the present embodiment is useful for producing electronic devices.

<Laminated Board Material>

Possible examples of a specific application of the curable resin composition of the present embodiment include a laminated board material. That is, a laminated board material provided with the curable resin composition of the present embodiment or a cured product of the curable resin composition of the present embodiment is a possible example of a preferable use application.

More specifically, the laminated board material is provided with (i) a layer including the curable resin composition of the present embodiment or a cured product of the curable resin composition of the present embodiment, and (ii) a conductive metal layer. More specific examples thereof include a laminated board material formed by alternately laminating (i) a layer including the curable resin composition of the present embodiment or a cured product of the curable resin composition of the present embodiment, and (ii) a conductive metal layer.

<Electronic Component Encapsulant>

Other possible examples of a specific application of the curable resin composition of the present embodiment include an electronic component encapsulant including the curable resin composition of the present embodiment or a cured product of the curable resin composition of the present embodiment.

More specifically, examples of the electronic component encapsulant include examples in which various curing agents, fillers, pigments, and the like are blended with the curable resin composition of the present embodiment, and/or a cured product of the curable resin composition of the present embodiment in accordance with various applications and target characteristics, and crushed or processed into a suitable shape after mixing.

Embodiments of the present invention were described above, but these are examples of the present invention and it is possible to adopt various configurations other than those described above. In addition, the present invention is not limited to the embodiments described above and variations, improvements, and the like are included in the present invention within a range in which it is possible to achieve the purpose of the present invention.

EXAMPLES

A detailed description of embodiments of the present invention on the basis of Examples and Comparative Examples will be given below. To restate for clarity, the present invention is not limited only to the Examples.

Synthesis Example 1: Synthesis of Epoxy Resin Having Structure Represented by General Formula (4) (Unsubstituted Benzene Ring)

In a 500-mL glass flask provided with a stirrer, a dropping funnel, and a thermometer, 60 g (0.22 mol) of 1,1,1-trifluoro-2,2-bis(4-hydroxyphenyl) ethane, 248.6 g (1.48 mol) of epichlorohydrin, 97.0 g of isopropanol, and 35.0 g of water were introduced and heated in a water bath to an internal temperature of 40° C. Thereafter, the inside of the flask was heated to 65° C. while 43.0 g (0.51 mol) of 48% by mass sodium hydroxide solution was added dropwise in the inside of the flask over 1.5 hours. Thereafter, the reaction was completed by holding the flask for 1 hour while maintaining the inside of the flask at 65° C. The organic layer was recovered by a liquid separation operation and concentrated using an evaporator.

150 g of methyl isobutyl ketone and 2.1 g (25 mmol) of 48% by mass sodium hydroxide solution were added to the organic layer recovered and concentrated as described above. Thereafter, stirring was carried out at 65° C. for 1 hour, after which 50 g of water was added thereto. The aqueous layer was neutralized to pH 7 with 2.5 g of 10% by mass sodium dihydrogen phosphate solution. The organic layer recovered by the extraction operation was washed twice with 120 g of water and then the organic layer was recovered by an extraction operation. The recovered organic layer was concentrated using an evaporator to obtain 78.5 g of the desired epoxy resin.
[Physical Property Data]

1,1,1-trifluoro-2,2-bis(4-glycidyloxyphenyl)ethane $^1$H-NMR (400 MHz, CDCl$_3$, Si(CH$_3$)$_4$) δ (ppm): 2.60-2.67 (2H, m), 2.75-2.82 (2H, m), 3.20-3.30 (2H, m), 3.70-3.85 (2H, m), 4.20-4.30 (2H, m), 4.70-4.85 (1H, m), 6.83-6.95 (4H, m), 7.23-7.35 (4H, m)
$^{19}$F-NMR (400 MHz, CDCl$_3$, CFCl$_3$) δ (ppm): −65.8 (3F, d, J=8.7 Hz)

Synthesis Example 2: Synthesis of Epoxy Resin Having Structure Represented by General Formula (5) (One Benzene Ring Substituted by One Methyl Group In a 50-mL glass flask provided with a stirrer, a dropping funnel, and a thermometer, 2.37 g (8.0 mmol) of 1,1,1-trifluoro-2,2-bis(3-methyl-4-hydroxyphenyl)ethane, 7.4 g (80 mmol) of epichlorohydrin and 3.0 g of isopropanol were introduced. Then, 1.5 g (18 mmol) of 48% by mass sodium hydroxide solution was added dropwise in the inside of the flask over 10 minutes at room temperature. Thereafter, the reaction was completed by heating the flask in a water bath at 65° C. and holding for 30 minutes.

After completion of the reaction, 20 g of methyl isobutyl ketone was added to the inside of the flask and the organic layer was washed three times with 20 g of water. Thereafter, the organic layer was recovered by an extraction operation. The organic layer was concentrated using an evaporator to obtain 3.1 g of the desired epoxy resin.
[Physical Property Data]

1,1,1-trifluoro-2,2-bis(3-methyl-4-glycidyloxyphenyl)ethane $^1$H-NMR (400 MHz, CDCl$_3$, Si(CH$_3$)$_4$) δ (ppm): 2.17 (6H, s), 2.65-2.69 (2H, m), 2.77-2.81 (2H, m), 3.42-3.29 (2H, m), 3.78-3.85 (2H, m), 4.23-4.29 (2H, m), 4.60-4.75 (1H, m), 6.81-6.87 (2H, m), 7.13-7.21 (4H, m)
19F-NMR (400 MHz, CDCl$_3$, CFCl$_3$) δ (ppm): −65.7 (3F, d, J=11.6 Hz)

Synthesis Example 3: Synthesis of Epoxy Resin Having Structure Represented by General Formula (6) (One Benzene Ring Substituted by Two Methyl Groups)

In a 500-mL glass flask provided with a stirrer, a dropping funnel, and a thermometer, 50 g (0.15 mol) of 1,1,1-trifluoro-2,2-bis(3,5-(dimethyl-4-hydroxyphenyl)ethane, 171.0 g (1.85 mol) of epichlorohydrin, 66.7 g of isopropanol, and 23.9 g of water were introduced and heated in a water bath to an internal temperature of 40° C. Thereafter, the inside of the flask was heated to 65° C. while 29.5 g (0.35 mol) of 48% by mass sodium hydroxide solution was added dropwise in the inside of the flask over 1.5 hours. Thereafter, the reaction was completed by holding the flask for 1 hour while maintaining the inside of the flask at 65° C. The organic layer was recovered by a liquid separation operation and concentrated using an evaporator.

102 g of methyl isobutyl ketone and 1.4 g (17 mmol) of 48% sodium hydroxide solution were added to the organic layer recovered and concentrated as described above. Thereafter, stirring was carried out at 65° C. for 1 hour, and then the aqueous layer was neutralized to pH 7 with 50 g of water and 2.0 g of 10% by mass sodium dihydrogen phosphate solution. The organic layer recovered in the extraction operation was washed twice with 100 g of water and then the organic layer was recovered by an extraction operation. The recovered organic layer was concentrated using an evaporator to obtain 60.5 g of the desired epoxy resin.
[Physical Property Data]

1,1,1-trifluoro-2,2-bis(3,5-dimethyl-4-glycidyloxyphenyl)ethane $^1$H-NMR (400 MHz, CDCl$_3$, Si(CH$_3$)$_4$) δ (ppm): 2.20 (12H, s), 2.56-2.60 (2H, m), 2.75-2.80 (2H, m), 3.24-3.31 (2H, m), 3.52-3.59 (2H, m), 4.00-4.08 (2H, m), 4.53-4.73 (1H, m), 7.08 (4H, s)
$^{19}$F-NMR (400 MHz, CDCl$_3$, CFCl$_3$) δ (ppm): −65.4 (3F, d, J=11.6 Hz)

Synthesis Example 4: Synthesis of Epoxy Resin Having Structure Represented by General Formula (7) (Benzene Ring Substituted with Fluorine Atom)

In a 50-mL glass flask provided with a stirrer, a dropping funnel, and a thermometer, 2.43 g (8.0 mmol) of 1,1,1- trifluoro-2,2-bis(3-fluoro-4-hydroxyphenyl)ethane, 7.4 g (80 mmol) of epichlorohydrin, and 3.0 g of isopropanol were introduced. Then, 1.5 g (18 mmol) of 48% by mass sodium hydroxide solution was added dropwise in the inside of the flask over 10 minutes at room temperature. Thereafter, the reaction was completed by heating the flask in a water bath at 65° C. and holding for 30 minutes.

After completion of the reaction, the organic layer was recovered by a liquid separation operation and the recovered organic layer was concentrated using an evaporator. To the concentrated organic layer, 20 g of methyl isobutyl ketone was added and washing was carried out twice with 20 g of water. Thereafter, the organic layer was recovered by an extraction operation. The organic layer was concentrated using an evaporator to obtain 2.5 g of the desired epoxy resin.

[Physical Property Data]

1,1,1-trifluoro-2,2-bis(3-fluoro-4-glycidyloxyphenyl)ethane $^1$H-NMR (400 MHz, CDCl$_3$, Si(CH$_3$)$_4$) δ (ppm): 2.60-2.70 (2H, m), 2.75-2.85 (2H, m), 3.20-3.35 (2H, m), 3.80-3.90 (2H, m), 4.30-4.40 (2H, m), 4.70-4.90 (1H, m), 7.02-7.21 (6H, s)
$^{19}$F-NMR (400 MHz, CDCl$_3$, CFCl$_3$) δ (ppm): −66.2 (3F, d, J=11.6 Hz), −133.8 (2F, t, J=11.6 Hz)

Synthesis Example 5: Synthesis of Epoxy Resin Having Structure Represented by General Formula (4) (Unsubstituted Benzene Ring), High Molecular Weight Type In a 100-mL glass flask provided with a stirrer, a dropping funnel, and a thermometer, 23.8 g (89 mmol) of 1,1,1-trifluoro-2,2-bis(4-hydroxyphenyl)ethane, 17.3 g (0.19 mol) of epichlorohydrin, and 47.5 g of water were introduced and heated in a water bath to an internal temperature of 50° C. Thereafter, the internal temperature was heated to 80° C. while 33.9 g (0.21 mol) of 25% by mass sodium hydroxide solution was added dropwise in the inside of the flask over 20 minutes. Thereafter, the reaction was completed by holding the flask for 30 minutes while maintaining the inside of the flask at 80° C. Thereafter, 90 g of methyl isobutyl ketone was added to the inside of the flask and the organic layer recovered in the extraction operation was washed with 60 g of water. The organic layer was recovered by an extraction operation. The recovered organic layer was concentrated using an evaporator to obtain 32.2 g of crude epoxy resin.

To the obtained crude epoxy resin, 60.8 g of methyl isobutyl ketone and 0.57 g (6.8 mmol) of 48% sodium hydroxide solution were added and stirred at 65° C. for 1 hour. Thereafter, the aqueous layer was neutralized to pH 7 with 34 g of methyl isobutyl ketone, 31 g of water, and 5.0 g of a 10% by mass sodium dihydrogen phosphate solution. The organic layer recovered in the extraction operation was washed with 60 g of water and then the organic layer was recovered by an extraction operation. The recovered organic layer was concentrated using an evaporator to obtain 30.1 g of the desired epoxy resin.

Synthesis Example 6: Synthesis of Epoxy Resin Having Structure Represented by General Formula (5) (One Benzene Ring Substituted by One Methyl Group), High Molecular Weight Type In a 100-mL glass flask provided with a stirrer, a dropping funnel, and a thermometer, 26.3 g (89 mmol) of 1,1,1-trifluoro-2,2-bis(3-methyl-4-hydroxyphenyl)ethane, 17.3 g (0.19 mol) of epichlorohydrin, and 47.5 g of water were introduced and heated in a water bath to an internal temperature of 50° C. Thereafter, the internal temperature was heated to 80° C. while 33.9 g (0.21 mol) of 25% by mass sodium hydroxide solution was added dropwise therein over 20 minutes. Thereafter, the reaction was completed by holding the flask for 30 minutes while maintaining the inside of the flask at 80° C.

After completion of the reaction, 90 g of methyl isobutyl ketone was added to the inside of the flask and the organic layer recovered in the extraction operation was washed with 60 g of water. Thereafter, the organic layer was recovered by an extraction operation. The recovered organic layer was concentrated using an evaporator to obtain 34.7 g of crude epoxy resin.

To the obtained crude epoxy resin, 60.8 g of methyl isobutyl ketone and 0.57 g (6.8 mmol) of 48% sodium hydroxide solution were added and then stirring was carried out at 65° C. for 1 hour. Thereafter, the aqueous layer was neutralized to pH 7 with 34 g of methyl isobutyl ketone, 30 g of water, and 4.8 g of a 10% by mass sodium dihydrogen phosphate solution. The organic layer recovered in the extraction operation was washed with 60 g of water and then the organic layer was recovered by an extraction operation. The recovered organic layer was concentrated using an evaporator to obtain 33.8 g of the desired epoxy resin.

Synthesis Example 7: Synthesis of Epoxy Resin Having Structure Represented by General Formula (7) (Benzene Ring Substituted with Fluorine Atom), High Molecular Weight Type In a 100-mL glass flask provided with a stirrer, a dropping funnel, and a thermometer, 20.0 g (66 mmol) of 1,1,1-trifluoro-2,2-bis(3-fluoro-4-hydroxyphenyl)ethane, 12.8 g (0.14 mol) of epichlorohydrin, and 35.1 g of water were introduced and heated in a water bath to an internal temperature of 40° C. Thereafter, the internal temperature was heated to 80° C. while 25.3 g (0.16 mol) of 25% by mass sodium hydroxide solution was added dropwise in the inside of the flask over 20 minutes. Thereafter, the reaction was completed by holding the flask for 30 minutes while maintaining the inside of the flask at 80° C. Thereafter, 67 g of methyl isobutyl ketone was added to the inside of the flask and the organic layer recovered in the extraction operation was washed with 44 g of water. The organic layer was recovered by an extraction operation. The recovered organic layer was concentrated using an evaporator to obtain a crude epoxy resin.

To the obtained crude epoxy resin, 45 g of methyl isobutyl ketone and 0.42 g (5.1 mmol) of 48% sodium hydroxide solution were added and then stirring was carried out at 65° C. for 1 hour. Thereafter, the aqueous layer was neutralized to pH 7 with 25 g of methyl isobutyl ketone, 22 g of water, and 5.2 g of 10% by mass sodium dihydrogen phosphate solution. The organic layer recovered in the extraction operation was washed with 44 g of water and then the organic layer was recovered by an extraction operation. The recovered organic layer was concentrated using an evaporator to obtain 28.8 g of the desired epoxy resin.

Synthesis Example 8: Synthesis of Epoxy Acrylate Resin Having Structure Represented by General Formula (8) (Unsubstituted Benzene Ring)

In a 50-mL glass flask provided with a stirrer, a reflux condenser, and a thermometer, 5.0 g of the epoxy resin obtained in Synthesis Example 1 (epoxy equivalent weight 200 g/equivalent weight), 1.8 g of acrylic acid (25 mmol), 10 mg of hydroquinone, 3.1 g of diethylene glycol monoethyl ether acetate, and 50 mg triphenylphosphine were introduced. The reaction was carried out for 2 hours by heating the internal temperature to 110° C. using an oil bath while introducing dry air in the inside of the flask at 10 mL/min. Thereafter, the reaction was completed by heating the internal temperature to 120° C. and carrying out a reaction for a further 5 hours. After cooling, a solution including the desired epoxy acrylate resin was obtained.
[Physical Property Data]
Number average molecular weight (Mn)=696, Weight average molecular weight (Mw)=864, Polydispersity (Mw/Mn)=1.2
Solid content concentration=69% by mass Synthesis Example 9: Synthesis of Epoxymethacrylate Resin Having Structure Represented by General Formula (9) (Unsubstituted Benzene Ring)

In a 50-mL glass flask provided with a stirrer, a reflux condenser, and a thermometer, 5.0 g (epoxy equivalent weight 200 g/equivalent weight) of the epoxy resin obtained in Synthesis Example 1, 2.2 g (25 mmol) of methacrylic acid, 10 mg of hydroquinone, 3.2 g of diethylene glycol monoethyl ether acetate, and 50 mg of triphenylphosphine were introduced. The reaction was carried out for 2 hours by heating the internal temperature to 110° C. using an oil bath while introducing dry air in the inside of the flask at 10 mL/min. Thereafter, the reaction was completed by heating the internal temperature to 120° C. and carrying out a reaction for a further 14 hours. After cooling, a solution including the desired epoxy methacrylate resin was obtained.
[Physical Property Data]
Number average molecular weight (Mn)=766, Weight average molecular weight (Mw)=1095, Polydispersity (Mw/Mn)=1.4
Solid content concentration=69% by mass Synthesis Example 10: Synthesis of Epoxymethacrylate Resin Having Structure Represented by General Formula (9) (Unsubstituted Benzene Ring In a 50-mL glass flask provided with a stirrer, a reflux condenser, and a thermometer, 3.0 g (11 mmol) of 1,1,1-trifluoro-2,2-bis(4-hydroxyphenyl)ethane, 3.0 g (22 mmol) of glycidyl methacrylate, 0.5 g (2 mmol) of tetraethylammonium bromide, and 10 mg of hydroquinone were introduced. The reaction was carried out for 1 hour by heating the internal temperature to 120° C. using an oil bath while introducing dry air in the inside of the flask at 10 mL/min. A solution including the desired epoxymethacrylate resin was obtained.
[Physical Property Data]
Number average molecular weight (Mn)=687, Weight average molecular weight (Mw)=782, Polydispersity (Mw/Mn)=1.1.

Comparative Synthesis Example 1: Synthesis of Epoxy Resin Having —C(CF$_3$)$_2$— Structure In a 1-L glass flask provided with a stirrer, a dropping funnel, and a thermometer, 96.9 g (0.29 mol) of 2,2-bis(4-hydroxyphenyl)hexafluoropropane, 320.0 g (3.46 mol) of epichlorohydrin, 125.0 g of isopropanol, and 45.0 g of water were introduced and heated in a water bath to an internal temperature of 40° C. Thereafter, the inside of the flask was heated to 65° C. while 55.2 g (0.66 mol) of 48% by mass sodium hydroxide solution was added dropwise in the inside of the flask over 1.5 hours. Thereafter, the reaction was completed by holding the flask for 1 hour while maintaining the inside of the flask at 65° C. The organic layer was recovered by a liquid separation operation and concentrated using an evaporator.

To the organic layer recovered and concentrated as described above, 194 g of methyl isobutyl ketone and 2.7 g (33 mmol) of 48% by mass sodium hydroxide solution were added. Thereafter, stirring was carried out at 65° C. for 1 hour, after which the aqueous layer was neutralized to pH 7 with 97 g of water and 4.7 g of 10% by mass sodium dihydrogen phosphate solution. To the organic layer recovered in the extraction operation, 97 g of methyl isobutyl ketone was added, washing was carried out twice with 196 g of water, and then the organic layer was recovered by an extraction operation. The recovered organic layer was concentrated using an evaporator to obtain 127.8 g of the desired epoxy resin.

Comparative Synthesis Example 2: Synthesis of Epoxy Resin Having —C(CF$_3$)$_2$— Structure Monomer Synthesis In a 100-mL stainless-steel autoclave reactor provided with a pressure gauge, thermometer protection tube, insertion tube, and stirring motor, 32.4 g (0.30 mol) of orthocresol, 24.9 g (0.15 mol) of hexafluoroacetone, and 27.0 g (0.18 mol) of trifluoromethanesulfonic acid were introduced. The reactor was heated in an oil bath at 100° C. and the reaction was completed in 18 hours.

After cooling to room temperature, 500 g of ethyl acetate was added to the reactor to dissolve a solid product, the result was poured into 200 g of ice water, the organic layer recovered by an extraction operation was washed three times with 200 g of water, and the organic layer was recovered by a liquid separation operation. The organic layer was concentrated using an evaporator to obtain 54.3 g of a crude reaction product.

To the crude reaction product described above, 108 g of heptane and 28 g of toluene were added and heated in an 80° C. water bath to obtain a homogeneous solution. Thereafter, the solution was cooled in ice water to precipitate crystals. The crystals were recovered by suction filtration and dried in an evaporator to obtain 32.4 g of 2,2-bis(3-methyl-4-hydroxyphenyl)hexafluoropropane, which was the desired product with a 60% yield and 99% GC purity.
Epoxy Resin Synthesis In a 50-mL glass flask provided with a stirrer, dropping funnel, and thermometer, 2.91 g (8.0 mmol) of 2,2-bis(3-methyl-4-hydroxyphenyl) hexafluoropropane, 7.4 g (80 mmol) of epichlorohydrin, and 3.0 g of isopropanol were introduced. Then, 1.5 g (18 mmol) of 48% by mass sodium hydroxide solution was added dropwise in the inside of the flask over 10 minutes at room temperature. Thereafter, the reaction was completed by heating in a water bath at 65° C. holding the flask for 30 minutes. The organic layer was recovered by a liquid separation operation and the organic layer was concentrated using an evaporator.

To the organic layer concentrated as described above, 20 g of methyl isobutyl ketone was added and the organic layer was washed twice with 20 g of water. Thereafter, the organic layer was recovered by an extraction operation. The recovered organic layer was concentrated using an evaporator to obtain 3.6 g of the desired epoxy resin.

Comparative Synthesis Example 3: Synthesis of Epoxy Resin Having —$C(CF_3)_2$— Structure, High Molecular Weight Type In a 100-mL glass flask provided with a stirrer, a dropping funnel, and a thermometer, 30.0 g (89 mmol) of 2,2-bis(4-hydroxyphenyl)hexafluoropropane, 17.3 g (3.46 mol) of epichlorohydrin, and 47.5 g of water were introduced and heated in a water bath to an internal temperature of 45° C. Thereafter, the flask was heated to 80° C. while 33.9 g (0.21 mol) of 25% by mass sodium hydroxide solution was added dropwise in the inside of the flask over 20 minutes. Thereafter, the reaction was completed by holding the inside of the flask for 30 minutes while maintaining the inside of the flask at 80° C., 90 g of methyl isobutyl ketone was added to the flask, and the organic layer was recovered by a liquid separation operation and washed with 60 g of water. The organic layer was recovered by a liquid separation operation and concentrated using an evaporator to recover 40.5 g of a crude epoxy resin.

To the obtained crude epoxy resin, 60.8 g of methyl isobutyl ketone and 0.57 g (6.8 mmol) of 48% sodium hydroxide solution were added and then stirring was carried out in a water bath at 65° C. for 1 hour. Thereafter, the aqueous layer was neutralized to pH 7 with 33.8 g of methyl isobutyl ketone, 30 g of water, and 7.0 g of 10% by mass sodium dihydrogen phosphate solution. The organic layer recovered in the extraction operation was washed with 60 g of water and then the organic layer was recovered by an extraction operation. The recovered organic layer was concentrated using an evaporator to obtain 33.1 g of the desired epoxy resin.

Comparative Synthesis Example 4: Synthesis of Epoxy Resin Having —$C(CF_3)_2$— Structure, High Molecular Weight Type In a 50-mL glass flask provided with a stirrer, dropping funnel, and thermometer, 5.8 g (16 mmol) of 2,2-bis(3-methyl-4-hydroxyphenyl) hexafluoropropane, 3.1 g (34 mmol) of epichlorohydrin, and 8.3 g of water were introduced and heated in a water bath to an internal temperature of 50° C. Thereafter, the internal temperature was heated to 80° C. while 5.9 g (37 mmol) of 25% by mass sodium hydroxide solution was added dropwise to the inside of the flask over 10 minutes. Thereafter, the reaction was completed by holding the flask for 30 minutes while maintaining the inside of the flask at 80° C. Thereafter, 20 g of methyl isobutyl ketone was added to the inside of the flask and the organic layer recovered in the extraction operation was washed twice with 30 g of water. The organic layer was recovered by an extraction operation. The recovered organic layer was concentrated using an evaporator to obtain 6.4 g of the desired epoxy resin.

Comparative Synthesis Example 5: Synthesis of Epoxy Acrylate Resin Having —$C(CF_3)_2$— Structure In a 50-mL glass flask provided with a stirrer, a reflux condenser, and thermometer, 5.0 g (epoxy equivalent weight 234 g/equivalent weight) of the epoxy resin obtained in Comparative Synthesis Example 1, 1.5 g (21 mmol) of acrylic acid, 10 mg of hydroquinone, 2.9 g of diethylene glycol monoethyl ether acetate, and 50 mg of triphenylphosphine were introduced. The reaction was carried out for 2 hours by heating the internal temperature to 110° C. using an oil bath while introducing dry air at 10 mL/min. Thereafter, the reaction was completed by heating the internal temperature of 120° C. and carrying out a reaction for a further 7 hours. After cooling, a solution including the desired epoxy acrylate resin was obtained.
[Physical Property Data]
Number average molecular weight (Mn)=746, Weight average molecular weight (Mw)=880, Polydispersity (Mw/Mn)=1.2 Solid content concentration=69% by mass.

Comparative Synthesis Example 6: Synthesis of Epoxymethacrylate Resin Having —$C(CF_3)_2$— Structure In a 50-mL glass flask provided with a stirrer, a reflux condenser, and thermometer, 5.0 g of the epoxy resin obtained in Comparative Synthesis Example 1 (epoxy equivalent weight 237 g/equivalent weight), 1.8 g (21 mmol) of methacrylic acid, 10 mg of hydroquinone, 3.1 g of diethylene glycol monoethyl ether acetate, and 50 mg of triphenylphosphine were introduced, the reaction was carried out for 2 hours by heating the internal temperature to 110° C. using an oil bath while introducing dry air at 10 mL/min, then, the reaction was completed by heating the internal temperature to 120° C. and carrying out a reaction for a further 14 hours. After cooling, the desired epoxy methacrylate resin solution was obtained.
[Physical Property Data]
Number average molecular weight (Mn)=795, Weight average molecular weight (Mw)=876, Polydispersity (Mw/Mn)=1.1

Solid content concentration=69% by mass.

Here, in the above description, the solid content concentration is specified for some curable resins (epoxy (meth) acrylate resins). This solid content concentration was calculated from the ratio of raw materials other than solvents used in the reaction to the total mass including solvents.
<Epoxy Equivalent Weight>

In the obtained resins, for the resins having epoxy groups, the epoxy equivalent weight was measured in accordance with JIS K 7236:2009.
<Measurement of "n Value" by Liquid Chromatography (LC)>

Liquid chromatographic analysis was performed using an Agilent 1200 series manufactured by Agilent Technologies, Inc. The specific conditions of the measurement are illustrated below.

Mobile phase: ultrapure water/acetonitrile (35/65-10/90).
Column: YMC-Pac (ODS-AM, AM12 SOJ-1506WT)
Column oven temperature: 40° C.
Column flow rate: 1.0 mL/min
Detector: UV light at 254 nm wavelength
Sample preparation method: approximately 10 mg of epoxy resin was dissolved in 2 g of acetonitrile and filtered through a filter with a pore size of 0.5 μm to prepare a sample.

In the chart obtained by LC measurement, the peak with the smallest number of outflow seconds was the peak of the curable resin with n=0 and the peak with the next smallest number of outflow seconds was the peak of the curable resin with n=1 (peaks that were clearly noise or impurities were excluded). When the area of the entire chart is set at 100, the area of each peak is shown in the "LC area %" column in the table below.

<Measurement of Weight Average Molecular Weight Mw and Number Average Molecular Weight Mn>

The weight average molecular weight Mw and number average molecular weight Mn were measured using gel permeation chromatography (GPC, HLC-8320 manufactured by Tosoh Corporation) using polystyrene as standard. For the mobile phase, tetrahydrofuran (THF) was used and, for the column, TSKgel SuperHZ (3000×1+2000×2)/(6.0 mm I.D.×15 cm×3) was used.

Sample preparation method: approximately 10 mg of curable resin was dissolved in 2 g of tetrahydrofuran and filtered through a filter with a pore size of 0.5 μm to prepare a sample.

<Viscosity Measurement of Curable Resin: 100° C. or 25° C.>

The viscosity of the curable resin was measured under 1 atmospheric pressure using a rotational viscometer (manufactured by Anton Paar, product name: Physica MCR 51, measuring cone CP50-1). The settings of the apparatus were as follows. The viscosity at a shear rate of 1000 [1/s] in this measurement is shown in the table below.

Shear rate: Changes by logarithmically increasing and decreasing (start 10 [1/s]-end 1000 [1/s]).
Measuring interval: logarithmic (start 90 seconds-end 3 seconds).
Measuring points: 21
Temperature: 100° C. (epoxy resin), 25° C. (epoxy (meth) acrylate resin)

<Viscosity Measurement of Curable Resins: 40° C.>

For some curable resins, the viscosity was also measured at 40° C. Specifically, in the <Viscosity Measurement of Curable Resins: 100° C.> described above, the viscosity at a shear rate of 25 [1/s] when the heating temperature was changed from 100° C. to 40° C. is shown in the table below.

<Measurement of Total Chlorine Content>

The total chlorine content of some curable resins was measured on the basis of JIS K 7243-3:2005.

The results of the above measurements/evaluations are shown together in Table 1 and Table 2. In the tables, "–" indicates that measurement was not carried out for reasons of time or the like and "not measurable" indicates that the measurement was not possible because the viscosity was excessively high

TABLE 2

| Example/Comparative Example | | Mn | Mw | Mw/Mn | Viscosity (cP) 25° C. 1000/s |
|---|---|---|---|---|---|
| Synthesis Examples | 8 | 696 | 864 | 1.2 | 758 |
| | 9 | 766 | 1095 | 1.4 | 705 |
| Comparative Examples Synthesis | 5 | 746 | 880 | 1.2 | 876 |
| | 6 | 795 | 876 | 1.1 | 775 |

<Analysis of Results, Notes, and the Like>

From the comparison between Synthesis Example 1 and Comparative Synthesis Example 1, Synthesis Example 2 and Comparative Synthesis Example 2, Synthesis Example 5 and Comparative Synthesis Example 3, Synthesis Example 6 and Comparative Synthesis Example 4, and the like shown in Table 1, it is understood that the viscosity of the curable resin (epoxy resin) of the present embodiment provided with the —CH(CF$_3$)— structure is comparatively lower than that of the epoxy resin (equivalent to a product of the related art) provided with the —C(CF$_3$)$_2$— structure.

In addition, from the comparison between Synthesis Example 8 and Comparative Synthesis Example 5, and Synthesis Example 9 and Comparative Synthesis Example 6 shown in Table 2, it is understood that the viscosity of the epoxy (meth)acrylate provided with the —CH(CF$_3$)— structure is comparatively lower than that of the epoxy (meth) acrylate (equivalent to a product of the related art) provided with the —C(CF$_3$)$_2$— structure.

Furthermore, the total chlorine content of the curable resin of the present embodiment was sufficiently small.

Preparation and Evaluation of Curable Resin Compositions (Containing Curing Agent): Example 1 and Comparative Example 1

First, two types of curable resin compositions were prepared with the compositions shown in Table 2.

TABLE 1

| Example/Comparative Example | | Epoxy equivalent weight EE (g/equivalent weight) | LC Area % | | | | | GPC Measurement Results | | | Viscosity (cP) 100° C. | Viscosity (cP) 40° C. | Total chlorine content |
|---|---|---|---|---|---|---|---|---|---|---|---|---|---|
| | | | n = 0 | n = 1 | n = 2 | n = 3 | n = 4 | Mn | Mw | Mw/Mn | 1000/s | 25/s | (ppm) |
| Synthesis Examples | 1 | 200 | 76 | 6 | 3 | <1 | <1 | 328 | 355 | 1.2 | 35 | 3244 | 736 |
| | 2 | 228 | 77 | 13 | 2 | <1 | <1 | 380 | 436 | 1.1 | 76 | 61800 | — |
| | 3 | 228 | 80 | 5 | 1 | <1 | <1 | 401 | 421 | 1.1 | 161 | — | 1141 |
| | 4 | 238 | 62 | 17 | 3 | <1 | <1 | 424 | 507 | 1.1 | 61 | 18040 | — |
| | 5 | 348 | 29 | 21 | 13 | 8 | 4 | 786 | 1378 | 1.8 | 104 | — | — |
| | 6 | 400 | 25 | 22 | 14 | 8 | 5 | 904 | 1518 | 1.7 | 146 | — | — |
| | 7 | 316 | 23 | 19 | 10 | 6 | 6 | 1378 | 3379 | 2.5 | 221 | — | — |
| Comparative Synthesis Examples | 1 | 281 | 89 | 8 | 1 | <1 | <1 | 378 | 406 | 1.1 | 138 | Not measurable | — |
| | 2 | 277 | 77 | 16 | 3 | <1 | <1 | 455 | 522 | 1.1 | 264 | Not measurable | — |
| | 3 | 391 | 33 | 26 | 16 | 8 | 4 | 859 | 1416 | 1.6 | 172 | — | — |
| | 4 | 475 | 31 | 28 | 18 | 1 | <1 | 978 | 1454 | 1.5 | 317 | — | — |

TABLE 3

| Component | Example 1 | Comparative Example 1 |
|---|---|---|
| Epoxy resin of Synthesis Example 1 | 100 parts by mass | — |
| Epoxy resin of Comparative Synthesis Example 1 | — | 100 parts by mass |
| Curing agent | 83 parts by mass | 70 parts by mass |
| Curing accelerator | 0.8 parts by mass | 0.7 parts by mass |

In the above table, the curing agents and curing accelerators are as follows.
  Curing agent: methyl hexahydrophthalic anhydride (acid anhydride equivalent weight 165 g/equivalent weight).
  Curing accelerator: tributyl(ethyl)phosphonium diethyl phosphate (1% by mass with respect to acid anhydride mass)

7 g of the obtained curable resin composition was weighed into a 51 mm φ aluminium cup container and stirred at 100° C. for approximately 3 minutes to be uniform. Thereafter, the container was placed as is in an oven and heated at 100° C. for 3 hours and further at 140° C. for 3 hours. After heating, the result was cooled naturally to obtain a cured product.

The glass transition temperature of each cured product was measured using a differential scanning calorimeter. The glass transition temperature was measured using the differential scanning calorimeter (model name DSC7000, manufactured by Hitachi High-Tech Science Corporation) under the condition of a heating rate of 10° C./min.

The glass transition temperature of the cured product in Example 1 was 137° C. and the glass transition temperature of the cured product in Comparative Example 1 was 138° C. In other words, the glass transition temperatures (an indicator of heat resistance) of the cured products in Example 1 and Comparative Example 1 were almost the same.

When combined with the viscosity measurement results described above, it is understood that the epoxy resin of the present embodiment "has good heat resistance despite a low viscosity".

Preparation and Evaluation of Curable Resin Composition (Containing Curing Agent): Example 2 and Comparative Example 2

First, a curable resin composition with the composition shown in the table below was prepared.

TABLE 4

| Component | Example 2 | Comparative Example 2 |
|---|---|---|
| Epoxy resin of Synthesis Example 1 | 100 parts by mass | — |
| Bisphenol A epoxy resin | — | 100 parts by mass |
| Curing agent | 54 parts by mass | 44 parts by mass |
| Curing accelerator | 0.7 parts by mass | 0.7 parts by mass |
| Solvent | 83 parts by mass | 78 parts by mass |

In the above table, the bisphenol A epoxy resin, curing agent, curing accelerator, and solvent are as follows.
  Curing agent: Phenol novolac: HF-1M (manufactured by Meiwa Plastic Industries, Ltd., hydroxyl group equivalent weight: 107 g/equivalent weight).
  Curing accelerator: Triphenylphosphine (0.7% by mass with respect to epoxy resin mass)
  Bisphenol A epoxy resin: EPICLON 860 (manufactured by DIC Corporation, epoxy equivalent weight 242 g/equivalent weight)
  Solvent: diethylene glycol dimethyl ether The obtained curable resin composition was filtered through a filter with a pore size of 0.2 μm. Thereafter, coating was carried out on a stainless-steel substrate (length 50 mm, width 50 mm, and thickness 0.5 mm) by spin-coating and then heated on a hot plate at 160° C. for 2 hours and then further in an oven at 180° C. for 6 hours. After heating, a cured film with a film thickness of approximately 10 μm on the stainless-steel substrate was obtained by natural cooling.

On the surface of the obtained cured film on the stainless-steel substrate, gold was deposited using a vacuum deposition apparatus (manufactured by Sanyu Electron Co., Ltd., SC-701CT QUICK CARBON COATER and SC-MC QUICK COOL COATER). Using an impedance measurement apparatus (manufactured by Agilent Technologies 4294A Precision Impedance Analyzer 40 Hz-110M Hz, measurement jig: manufactured by Keysight, 16451B), the dielectric constant and dielectric loss tangent of the cured film were measured. The smaller the dielectric constant (s), the shorter the signal delay time when made into an integrated circuit, which is preferable. In addition, the smaller the dielectric loss tangent (tan δ), the lower the signal attenuation when made into an integrated circuit, which is preferable.

For the cured product in Example 2, the dielectric constant (1 MHz) was 3.23 and dielectric loss tangent (1 MHz) was 0.0317, while for the cured product in Comparative Example 2, the dielectric constant (1 MHz) was 3.52 and the dielectric loss tangent (1 MHz) was 0.0318. In other words, it is understood that the epoxy resin cured product of Example 2 including fluorine has better dielectric characteristics in comparison with the epoxy resin cured product of Comparative Example 2 not including fluorine.

<Preparation and Evaluation of Curable Resin Composition (not Including Curing Agent)>

First, a curable resin composition was prepared with the composition shown in the table below. As a curing accelerator, 1,2-dimethylimidazole was adopted.

TABLE 5

| Component | Parts by mass |
|---|---|
| Epoxy resin of Synthesis Example 1 | 100 |
| Curing accelerator | 2 |

3 g of the obtained curable resin composition was weighed into a 51 mm φ aluminum cup container and heated on a hot plate at 100° C. for 5 minutes and then for 2 hours at 150° C. Due to this, a cured product was obtained.

The glass transition temperature of the cured product was measured by a differential scanning calorimeter. The glass transition temperature was measured using the differential scanning calorimeter (model name DSC7000, manufactured by Hitachi High-Tech Science Corporation) under the condition of a heating rate of 10° C./min.

The glass transition temperature of the cured product was 138° C. From these results, it is understood that a cured product having the same level of heat resistance as Example 1 (with a curing agent) was obtained without using a curing agent.

This application claims priority based on Japanese Patent Application No. 2020-033227, filed on 28 Feb. 2020, the entire disclosure of which is hereby incorporated.

The invention claimed is:

1. A curable resin represented by General Formula (1),

[Chem. 1]

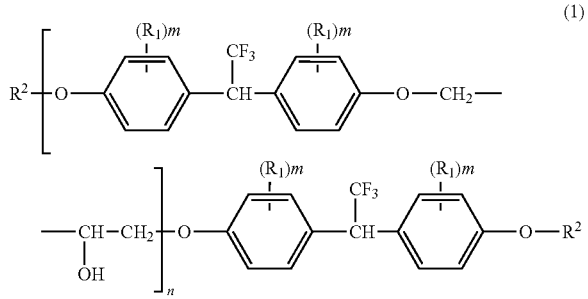

(1)

in General Formula (1), $R_1$ each independently represent a monovalent substituent, m is 0 to 4, n is 0 to 40, and $R^2$'s are each independently a monovalent group including a polymerizable functional group, wherein $R^2$ is a monovalent group including an epoxy group or a monovalent group including an ethylenically unsaturated group.

2. The curable resin according to claim 1, wherein $R^2$ is a monovalent group including a glycidyl group or a monovalent group including an epoxy (meth)acrylate skeleton.

3. The curable resin according to claim 1, wherein $R_1$ is at least one selected from the group consisting of an alkyl group, an alkoxy group, a cycloalkyl group, an aryl group, an alkenyl group, an alkynyl group, an aryloxy group, an amino group, an alkylamino group, an arylamino group, a cyano group, a nitro group, a silyl group, and a halogeno group.

4. The curable resin according to claim 1, wherein the curable resin is represented by General Formula (2),

[Chem. 2]

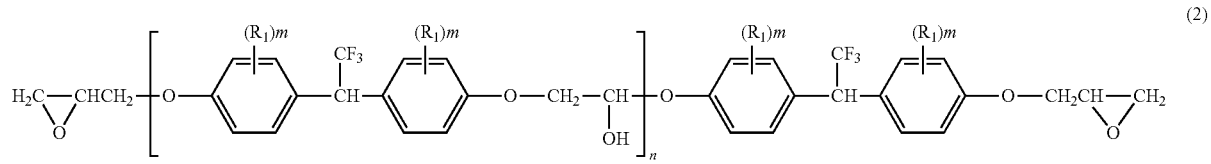

(2)

in General Formula (2), $R_1$, m, and n have the same definitions as in General Formula (1).

5. The curable resin according to claim 1, wherein the curable resin is represented by General Formula (3),

[Chem. 3]

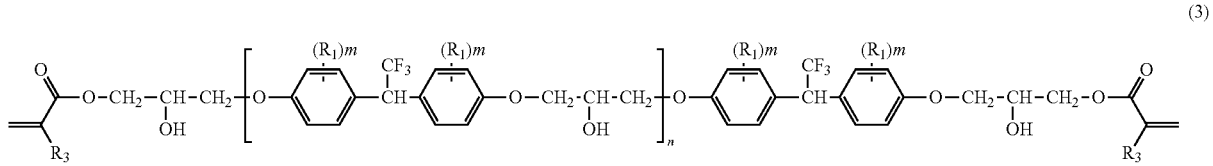

(3)

in General Formula (3), $R_1$, m, and n have the same definitions as in General Formula (1) and two $R_3$'s are each independently hydrogen or a methyl group.

6. The curable resin according to claim 1, wherein the curable resin is represented by General Formula (4),

[Chem. 4]

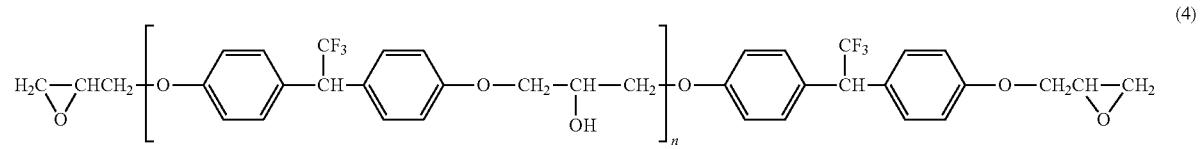

(4)

in General Formula (4), n has the same definition as in General Formula (1).

7. The curable resin according to claim 1, wherein the curable resin is represented by General Formula (5),

[Chem. 5]

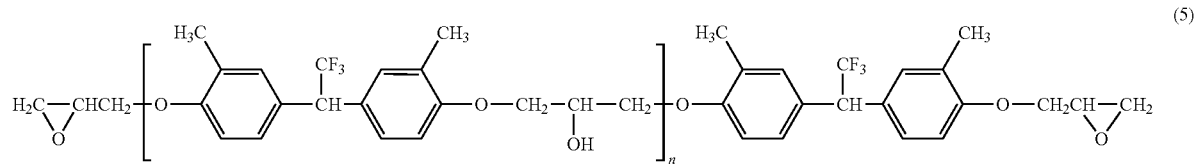

(5)

in General Formula (5), n has the same definition as in General Formula (1).

8. The curable resin according to claim 1, wherein the curable resin is represented by General Formula (6),

[Chem. 6]

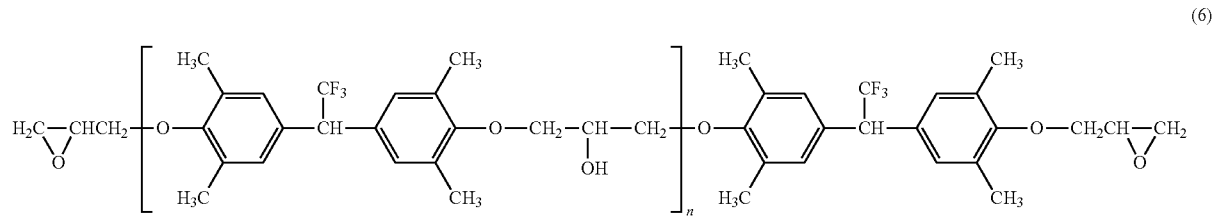

(6)

in General Formula (6), n has the same definition as in General Formula (1).

9. The curable resin according to claim 1, wherein the curable resin is represented by General Formula (7),

[Chem. 7]

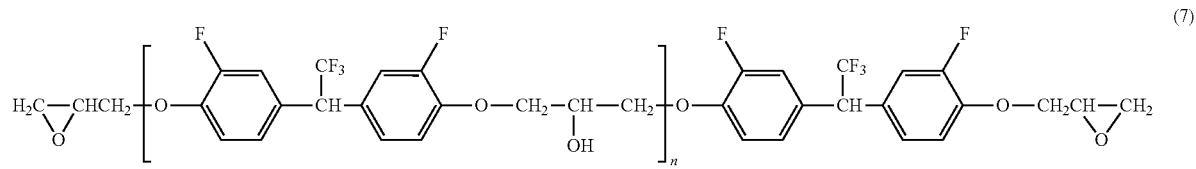

(7)

in General Formula (7), n has the same definition as in General Formula (1).

10. The curable resin according to claim 1, wherein the curable resin is represented by General Formula (8),

[Chem. 8]

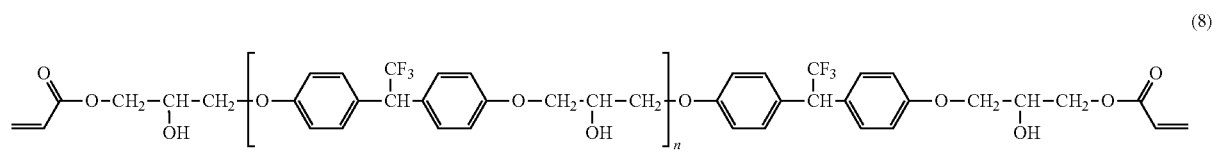

(8)

in General Formula (8), n has the same definition as in General Formula (1).

11. The curable resin according to claim 1,
wherein the curable resin is represented by General Formula (9),

[Chem. 9]

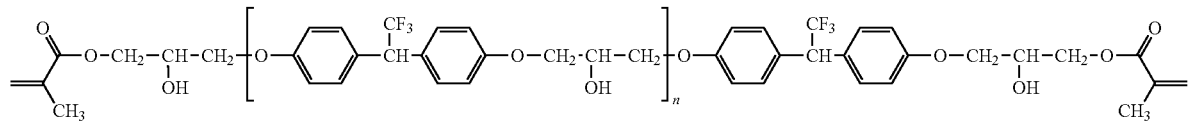
(9)

in General Formula (9), n has the same definition as in General Formula (1).

12. The curable resin according to claim 1,
wherein a total chlorine content is 0 ppm to 4000 ppm.

13. The curable resin according to claim 1,
wherein the curable resin is liquid at 40° C.

14. The curable resin according to claim 1,
wherein a curable resin in which n is 0 and a curable resin in which n is 1 to 40, in General Formula (1), are included.

15. A curable resin composition comprising:
the curable resin according to claim 1.

16. The curable resin composition according to claim 15,
further comprising: a curing agent.

17. A cured product comprising:
the curable resin composition according to claim 15.

18. An electronic device comprising:
the cured product according to claim 17.

19. A laminated board material comprising:
the curable resin composition according to claim 15; or a cured product of the curable resin composition.

20. An electronic component encapsulant comprising:
the curable resin composition according to claim 15; or a cured product of the curable resin composition.

21. A method for producing the curable resin according to claim 1, comprising:
reacting a bisphenol compound represented by General Formula (10) with epihalohydrin in the presence of a base,

[Chem. 10]

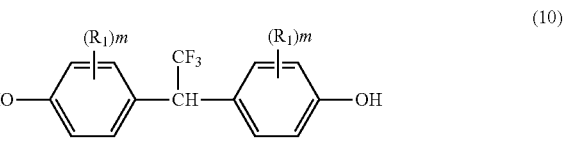
(10)

in General Formula (10), $R_1$ and m have the same definitions as in General Formula (1).

22. The method for producing the curable resin according to claim 1, further comprising:
reacting an epoxy resin compound represented by General Formula (2) with (meth)acrylic acid,

[Chem. 11]

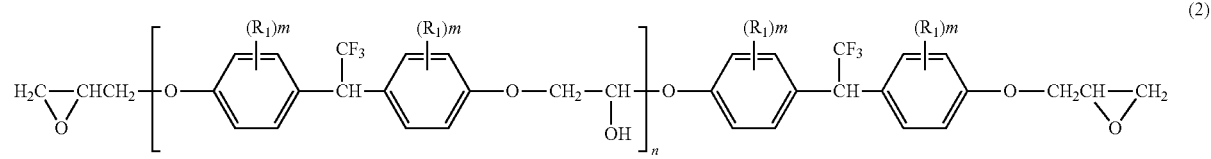
(2)

in General Formula (2), $R_1$, m and n have the same definitions as in General Formula (1).

23. The method for producing the curable resin according to claim 1, further comprising:
reacting a bisphenol compound represented by General Formula (10) with glycidyl (meth)acrylate,

[Chem. 12]

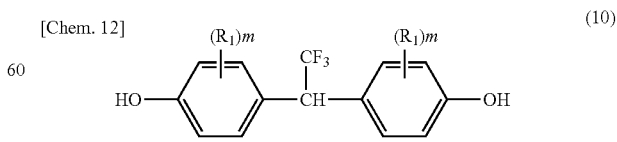
(10)

in General Formula (10), $R_1$ and m have the same definitions as in General Formula (1).

* * * * *